(12) United States Patent
Lee et al.

(10) Patent No.: US 12,380,953 B2
(45) Date of Patent: Aug. 5, 2025

(54) VOLTAGE GENERATOR AND MEMORY DEVICE INCLUDING THE SAME

(71) Applicant: Samsung Electronics Co., Ltd., Suwon-si (KR)

(72) Inventors: Yoonjae Lee, Suwon-si (KR); Byungjoon Yoo, Suwon-si (KR); Chiweon Yoon, Seoul (KR); Cheonan Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 216 days.

(21) Appl. No.: 18/184,842

(22) Filed: Mar. 16, 2023

(65) Prior Publication Data

US 2023/0307068 A1    Sep. 28, 2023

(30) Foreign Application Priority Data

Mar. 23, 2022 (KR) .................. 10-2022-0036227

(51) Int. Cl.
*G11C 16/04* (2006.01)
*G11C 16/30* (2006.01)
*G11C 16/32* (2006.01)
*H02M 3/07* (2006.01)

(52) U.S. Cl.
CPC .............. *G11C 16/30* (2013.01); *G11C 16/32* (2013.01); *H02M 3/07* (2013.01)

(58) Field of Classification Search
CPC ......... G11C 16/30; G11C 16/32; G11C 5/145; G11C 16/08; G11C 5/147; G11C 7/222; G11C 11/4074; G11C 5/063; G11C 7/22; H02M 3/07; H03K 17/693

USPC ...................................................... 365/185.18
See application file for complete search history.

(56) References Cited

U.S. PATENT DOCUMENTS

| | | | |
|---|---|---|---|
| 7,434,189 B2 | 10/2008 | Baumann et al. | |
| 7,602,231 B2 | 10/2009 | Yamamoto et al. | |
| 7,855,591 B2* | 12/2010 | Racape ................. | H02M 3/073 327/536 |
| 8,531,901 B2* | 9/2013 | Ogiwara ................ | G11C 16/30 365/206 |
| 8,930,866 B2 | 1/2015 | Sung et al. | |

(Continued)

FOREIGN PATENT DOCUMENTS

KR    10-2009-0015227 A    2/2009

*Primary Examiner* — Tha-O H Bui
(74) *Attorney, Agent, or Firm* — Harness, Dickey & Pierce, P.L.C.

(57) ABSTRACT

A memory device includes a memory cell array region electrically connected to a plurality of word lines and a plurality of bit lines and the memory cell array including a plurality of memory cells, and a peripheral circuit region under the memory cell array region, wherein the memory cell array region and the peripheral circuit region are electrically connected by through vias, the peripheral circuit region includes a voltage generator configured to generate an operating voltage to apply to the word lines, the voltage generator includes a pumping capacitor unit configured to charge and pump a voltage based on a clock signal, and a signal controller configured to control the clock signal and a current flowing through the pumping capacitor unit, the signal controller includes a clock driver configured to apply a clock signal to the pumping capacitor, and the signal controller is adjacent to the through vias.

18 Claims, 19 Drawing Sheets

(56) References Cited

U.S. PATENT DOCUMENTS

| | | |
|---|---|---|
| 9,093,167 B2 | 7/2015 | Jung |
| 9,305,919 B2 | 4/2016 | Yoo et al. |
| 9,369,115 B2 | 6/2016 | Kalluru et al. |
| 9,385,592 B2 * | 7/2016 | Watanabe ............ H02M 3/073 |
| 2014/0152379 A1 | 6/2014 | Fujimoto et al. |

* cited by examiner

VOLTAGE GENERATOR AND MEMORY DEVICE INCLUDING THE SAME

CROSS-REFERENCE TO RELATED APPLICATION

This application is based on and claims priority under 35 U.S.C. § 119 to Korean Patent Application No. 10-2022-0036227, filed on Mar. 23, 2022, in the Korean Intellectual Property Office, the disclosure of which is incorporated by reference herein in its entirety.

BACKGROUND

The inventive concepts relate to a voltage generator and a memory device including the same.

In order to improve the degree of integration of a multi-layered memory device, the number of word lines vertically stacked in a memory device is increasing. A voltage generator can provide a high current to simultaneously apply a constant operating voltage to a plurality of word lines of the multi-layered memory device. As the number of stacked layers of word lines increases, the size of a charge pump in the voltage generator also increases.

SUMMARY

Some example embodiments provide improvements to the efficiency of a charge pump in a voltage generator by changing the layout arrangement of the charge pump.

Some example embodiments provide a layout structure for optimizing or improving the arrangement of components of a charge pump in a voltage generator.

According to an example embodiment of the inventive concepts, there is provided a memory device. The memory device includes a memory cell array region electrically connected to a plurality of word lines and a plurality of bit lines and the memory cell array including a plurality of memory cells stacked vertically on a substrate, and a peripheral circuit region under the memory cell array region, wherein the memory cell array region and the peripheral circuit region are electrically connected to each other by through vias extending in a first direction, the peripheral circuit region includes a voltage generator configured to generate an operating voltage to apply to the word lines to operate the memory cells, the voltage generator includes a pumping capacitor unit configured to charge and pump a based on a clock signal, and a signal controller configured to control the clock signal and a current flowing through the pumping capacitor unit, and the signal controller includes a clock driver configured to apply a clock signal to the pumping capacitor and the signal controller is adjacent to the through vias.

According to another example embodiment of the inventive concepts, there is provided a voltage generator including first to n-th pumping stages. N is a natural number equal to or greater than 2, the first pumping stage includes a first pumping capacitor unit and the first signal controller, an n-th pumping stage includes an n-th pumping capacitor unit and an n-th signal controller, the first to n-th pumping stages are arranged side-by-side in a first direction, the first pumping capacitor unit and the first signal controller are arranged side-by-side in a second direction perpendicular to the first direction in the first pumping stage, the n-th pumping capacitor unit and the n-th signal controller are arranged side-by-side in a second direction perpendicular to the first direction in the n-th pumping stage, the first signal controller includes a plurality of first charge transfer switches and a first clock driver configured to apply a clock signal to the first pumping capacitor unit, the n-th signal controller includes a plurality of n-th charge transfer switches and an n-th clock driver configured to apply a clock signal to the n-th pumping capacitor unit, the plurality of first charge transfer switches are arranged between the first clock driver and the first pumping capacitor unit, and the plurality of n-th charge transfer switches are arranged between the n-th clock driver and the n-th pumping capacitor unit.

According to another example embodiment of the inventive concepts, there is provided a voltage generator including a plurality of pumping stages. The voltage generator includes a first pumping area on a first side with respect to a central portion of the voltage generator, and a second pumping area on a second side with respect to the central portion of the voltage generator, wherein the first pumping area and the second pumping area are symmetrical to each other around the central portion.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EXAMPLE EMBODIMENTS

Figure 1:
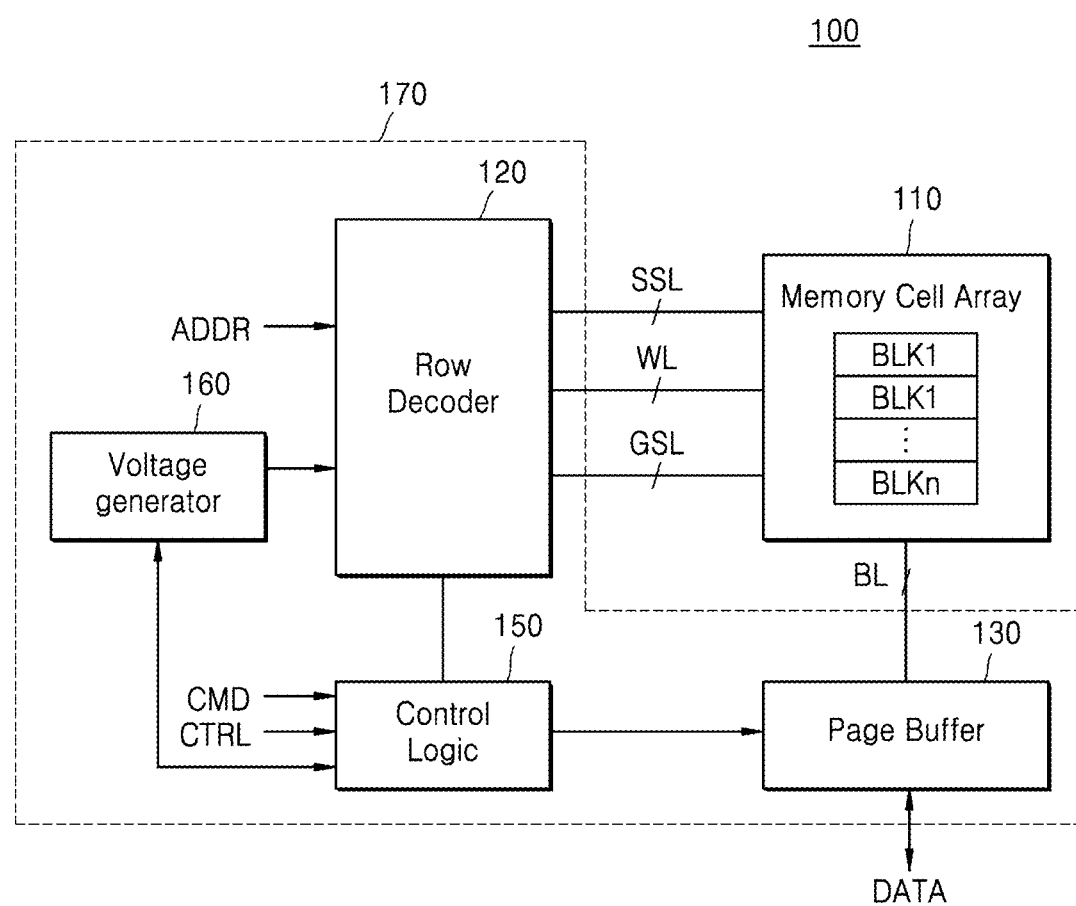
FIG. 1 is a block diagram showing a memory device according to some example embodiments.

FIG. 1 is a block diagram showing a semiconductor memory device according to some example embodiments.

Referring to FIG. 1, a semiconductor memory device 100 according to some example embodiments may include a memory cell array region 110 and a peripheral circuit region 170.

The memory cell array region 110 may include a plurality of memory cell blocks BLK1 to BLKn. The memory cell blocks BLK1 to BLKn may each include a plurality of memory cells. The memory cell blocks BLK1 to BLKn may be connected to the peripheral circuit region 170 through bit lines BL, word lines WL, at least one string select line SSL, and at least one ground select line GSL. In detail, the memory cell blocks BLK1 to BLKn may be connected to a row decoder 120 through the word lines WL, the at least one string select line SSL, and the at least one ground select line GSL. Also, the memory cell blocks BLK1 to BLKn may be connected to a page buffer 130 through the bit lines BL.

The peripheral circuit region 170 may receive an address ADDR, a command CMD, and a control signal CTRL from a device outside the semiconductor memory device 100 and may transmit and receive data DATA to and from the device outside the semiconductor memory device 100. The peripheral circuit region 170 may include a control logic 150, the row decoder 120, the page buffer 130, and a voltage generator 160 that generates various voltages needed or desired for operations.

Although not shown, the peripheral circuit region 170 may further include various sub-circuits like an input/output circuit and an error correction circuit for correcting an error in the data DATA read from the memory cell array region 110 of the semiconductor memory device 100.

The control logic 150 may be connected to the row decoder 120, the voltage generator 160, and the input/output circuit (not shown). The control logic 150 may control the overall operation of the semiconductor memory device 100. The control logic 150 may generate various internal control signals used in the semiconductor memory device 100 in response to a control signal CTRL.

For example, the control logic 150 may adjust the level of a voltage provided to the word lines WL and the bit lines BL when a memory operation like a program operation or an erase operation is performed.

The row decoder 120 may select at least one from among the memory cell blocks BLK1 to BLKn in response to the address ADDR and select at least one word line WL, at least one string select line SSL, and at least one ground select line GSL of a selected memory cell block BLK1 to BLKn. The row decoder 120 may transmit a voltage for performing a memory operation to the word line WL corresponding to the selected memory cell block BLK1 to BLKn.

The page buffer 130 may be connected to the memory cell array region 110 through the bit lines BL. The page buffer 130 may operate as a write driver or a sense amplifier. In detail, during a program operation, the page buffer 130 may operate as a write driver and apply a voltage according to data DATA to be stored in the memory cell array region 110 to the bit lines BL. Meanwhile, during a read operation, the page buffer 130 may operate as a sense amplifier to sense data DATA stored in the memory cell array region 110.

The voltage generator 160 may generate various types of internal voltages to perform a program operation, a read operation, and an erase operation on the memory cell array region 110 based on a control signal received from the control logic 150. For example, the voltage generator 160 may generate a word line voltage, a program voltage, a read voltage, a pass voltage, an erase verify voltage, or a program verify voltage. Also, the voltage generator 160 may further generate a string select line voltage and a ground select line voltage based on the control signal. Also, the voltage generator 160 may further generate a bit line voltage based on the control signal.

The voltage generator 160 may include a charge pump circuit that generates an output voltage. As described later, the charge pump circuit may include a clock driver. The clock driver in the charge pump circuit may improve the pumping efficiency by being disposed close to a through via (THV) that becomes a path for applying power.

A THV may refer to an electrical path for applying a clock signal and power to the clock driver. Alternatively, it may be interpreted that the THV via includes a voltage source that applies a clock signal and power to the clock driver. Hereinafter, it will be described that a THV refers to an electrical path through which a clock signal and power is applied.

Figure 2:
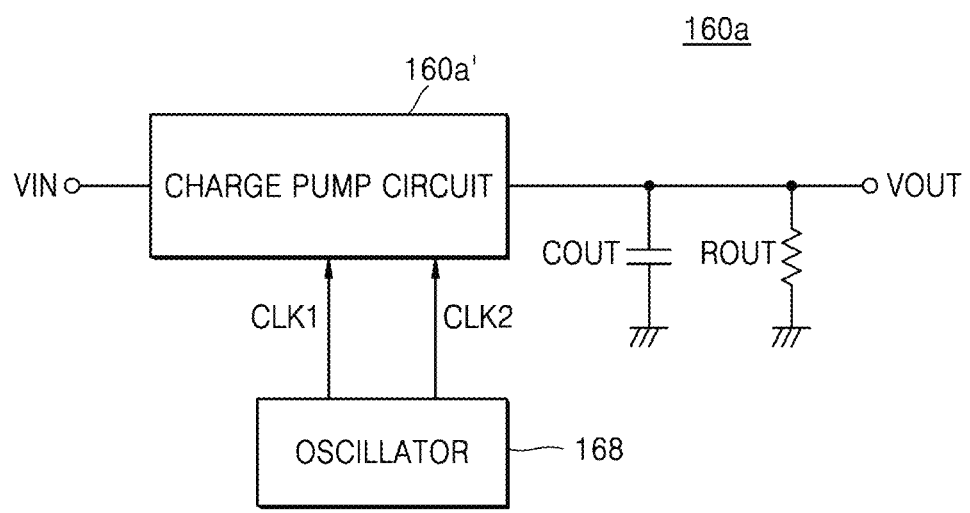
FIG. 2 is a block diagram showing a configuration of a voltage generator according to some example embodiments.

FIG. 2 is a block diagram showing a voltage generator included in a semiconductor memory device according to some example embodiments.

Referring to FIG. 2, a voltage generator 160a may include a charge pump circuit 160a', an oscillator 168, an output capacitor COUT, and an output resistor ROUT. The output capacitor COUT, and the output resistor ROUT may be connected to an output of the charge pump circuit 160a'. The charge pump circuit 160a' may receive an input voltage VIN, a first clock signal CLK1, and a second clock signal CLK2 and generate an output voltage VOUT based thereon. For example, the charge pump circuit 160' may operate in one of a positive charge pump mode for generating the output voltage VOUT by increasing the voltage level of the input voltage VIN by the increment of the first clock signal CLK1 (or the second clock signal CLK2) and a negative charge pump mode for generating the output voltage VOUT by decreasing the voltage level of the input voltage VIN by the decrement of the first clock signal CLK1 (or the second clock signal CLK2).

The charge pump circuit 160' may include a pumping capacitor unit and a signal controller. The pumping capacitor unit includes a pumping capacitor and may perform charge pumping according to a signal applied from the signal controller. The signal controller may apply a clock signal to the pumping capacitor unit. According to an example, the signal controller may include a clock driver. The signal controller may control the flow of a current flowing through the pumping capacitor. According to an example, the signal controller may include a charge transfer switch (CTS) and a high-voltage transistor (HV TR). According to an example, the CTS may be a pass transistor.

The voltage generator 160a may include the oscillator 168. The oscillator 168 may generate a clock signal and transmit the clock signal to the clock driver in the signal controller.

In an example embodiment below, a circuit diagram of the charge pump circuit 160a' included in the voltage generator 160a will be described first, and then an arrangement structure thereof will be described. According to an example, the charge pump circuit may include a pumping capacitor unit and a CTS, a HV TR, and a clock driver included in the signal controller.

Although FIGS. 3 to 7 are circuit diagrams of charge pumps included in the voltage generator 160, some of the components included in the charge pumps of the voltage generator 160 may be omitted for convenience of explanation.

Figure 3:
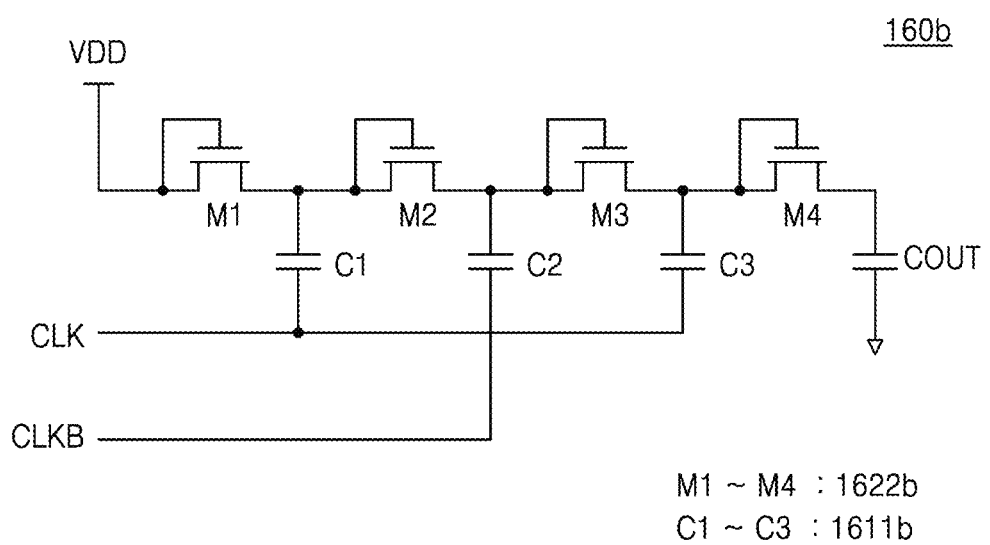
FIG. 3 is a circuit diagram of a charge pump in a voltage generator according to some c embodiments.

FIG. 3 is a circuit diagram of a Dickson-charge pump type charge pump included in a voltage generator according to some example embodiments.

According to an example, a charge pump of a voltage generator 160b includes a CTS M1 to which an external power voltage VDD is applied and CTS M2 to M4 to which externally generated clock signals CLK and CLKB having different phases are alternately applied through pumping capacitors C1 to C3 1611b. The clock signals CLK and CLKB supplied from the outside may have the same magnitude as the external power voltage VDD and may have a phase difference of 180 degrees from each other. According to an example, CTS M1 to M4 1622b may allow charges to increase in only one direction. According to one example, the two clock signals CLK and CLKB through the pumping capacitors C1 to C3 and 1611b apply charges in a direction in which charges increase through the CTS M1 to M4 1622b. By applying a first clock signal CLKB and a second clock signal CLK, the pumping capacitors C1 to C3 1611b are pumped, and by repeating this, a positive high voltage may be output. According to an example, the charge pump of the voltage generator 160b may be a Dickson-charge pump.

Figure 4:
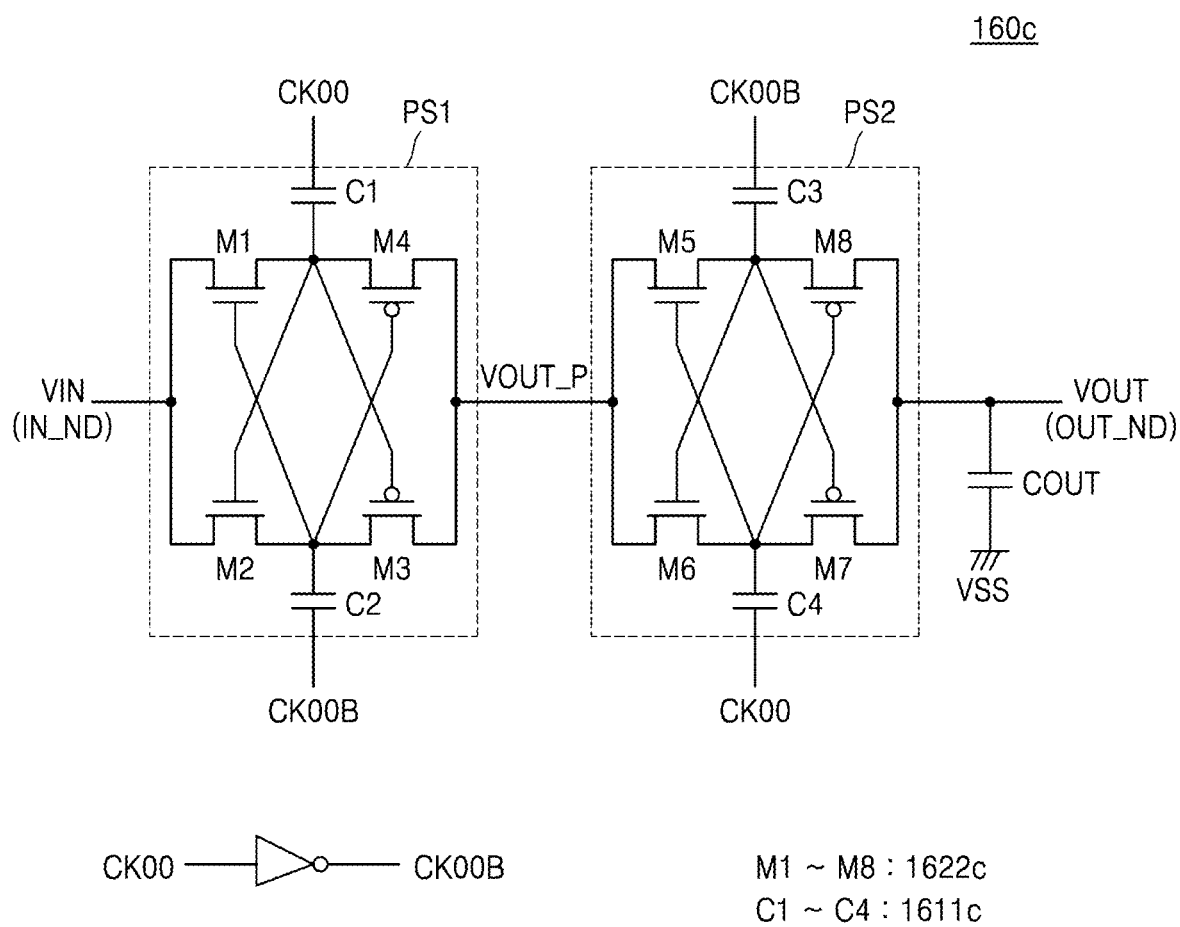
FIG. 4 is a circuit diagram of a charge pump in a voltage generator according to some example embodiments.

FIG. 4 is a circuit diagram of a charge pump included in a cross-coupled type voltage generator according to some example embodiments.

According to an example, a voltage generator 160c may include a charge pump including pumping capacitors C1 to C4 and transistors M1 to M8.

Referring to FIG. 4, the charge pump of the voltage generator 160c may include a first pumping stage PS1, a second pumping stage PS2, and an output capacitor COUT. The voltage generator 160c according to the example embodiment of FIGS. 4 to 5 may include pumping capacitors C1 to C4 1611c and CTS M1 to M8 1622c.

Meanwhile, although FIG. 4 shows a case in which the charge pump of the voltage generator 160c includes two pump stages PS1 and PS2 connected in series, the inventive concepts are not limited thereto. According to some example embodiments, the voltage generator 160c may further include a switch (not shown) connected to the second pumping stage PS2 in parallel and may be configured, such that, when the switch is turned on, a first output voltage VOUT_P of the first pumping stage PS1 is provided to an output terminal OUT_ND.

Alternatively, the charge pump of the voltage generator 160c may be configured to include two or more pump stages connected in series. When the charge pump of the voltage generator 160c includes a plurality of pumping stages, the voltage generator 160c may further include switches (not shown) respectively connected to some pumping stages in parallel and control turn-on of the switches according to the magnitude of a load connected to an output terminal, thereby controlling the magnitude of an output voltage applied to the output terminal.

The first pumping stage PS1 and the second pumping stage PS2 may operate according to a pair of complementary clock signals having phases opposite to each other. The first pumping stage PS1 may generate the first output voltage VOUT_P by pumping the input voltage VIN according to a first main clock CK00 and a first sub-clock CK00B. The first main clock CK00 and the first sub-clock CK00B may have phases opposite to each other and have the same period. For example, when the first main clock CK00 is at a high level, the first sub-clock CK00B may be at a low level. When the first main clock CK00 is at a low level, the first sub-clock CK00B may be at a high level.

The second pumping stage PS2 may generate a second output voltage VOUT by pumping the first output voltage VOUT_P according to a second main clock CK00B and a second sub-clock CK00 and provide a second output voltage VOUT to the output terminal OUT_ND. The second main clock CK00B and the second sub-clock CK00 may have phases opposite to each other and have the same period. For example, when the second main clock CK00B is at a high level, the second sub-clock CK00 may be at a low level. When the second main clock CK00B is at a low level, the second sub-clock CK00 may be at a high level. For example, the first main clock CK00 and the second main clock CK00B may have a phase difference of 90 degrees, and the first sub-clock CK00B and the second sub-clock CK00 may have a phase difference of 90 degrees.

The first pumping stage PS1 may include first to fourth transistors M1 to M4 and first and second capacitors C1 and C2. The second pumping stage PS2 may include fifth to eighth transistors M5 to M8 and third and fourth capacitors C3 and C4. A first capacitor C1 may receive the first main clock CK00 at a first end, and a second capacitor C2 may receive the first sub-clock CK00B at a first end. A third capacitor C3 may receive the second main clock CK00B at a first end, and a fourth capacitor C4 may receive the second sub-clock CK00 at a first end.

According to some example embodiments, the first to fourth transistors M1 to M4 and the fifth to eighth transistors M5 to M8 may each be a CTS.

Hereinafter, since the first pumping stage PS1 and the second pumping stage PS2 have substantially the same configuration, descriptions will be given below based on the first pumping stage PS1.

A first transistor M1 is connected between an input terminal IN_ND and a second end of the first capacitor C1 and may receive the first sub-clock CK00B transmitted to a gate terminal through the second capacitor C2. A second transistor M2 is connected between the input terminal IN_ND and a second end of the second capacitor C2 and may receive the first main clock CK00 transmitted through to a gate terminal through the first capacitor C1. A third transistor M3 is connected between the second end of the first capacitor C1 and the output terminal OUT_ND and may receive the first sub-clock CK00B transmitted to a gate terminal through the second capacitor C2. A fourth transistor M4 is connected between the second end of the second capacitor C2 and the output terminal OUT_ND and may receive the first main clock CK00 transmitted to a gate terminal through the first capacitor C1. For example, the first transistor M1 and the second transistor M2 may be configured as NMOS transistors, and the third transistor M3 and the fourth transistor M4 may be configured as PMOS transistors.

Figure 5:
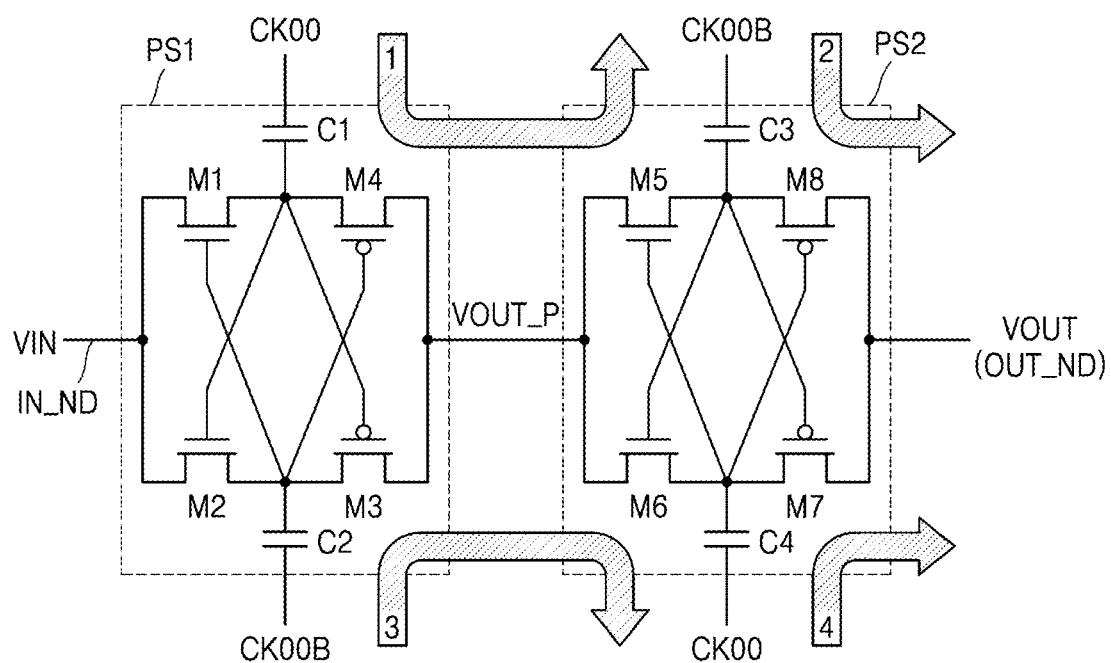
FIG. 5 is a diagram for describing an operation of the charge pump in the voltage generator of FIG. 4.
Figure 5:
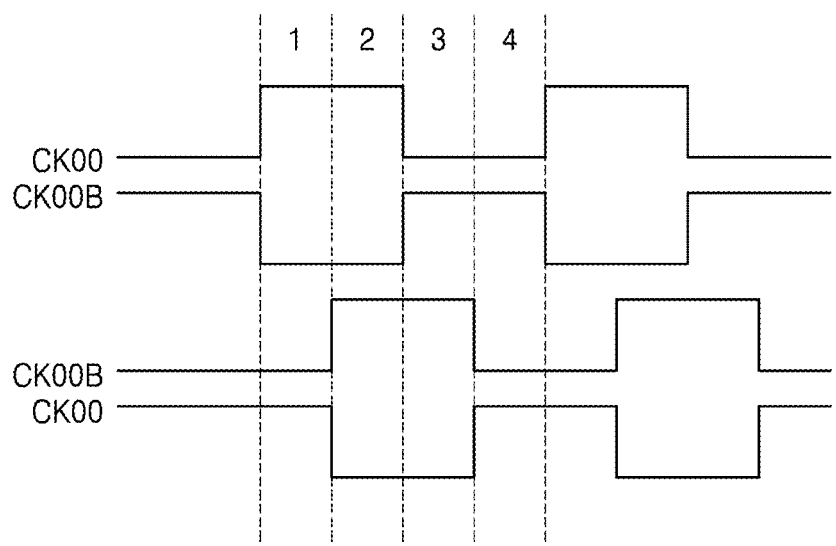

FIG. 5 is a circuit diagram and an operation waveform diagram for describing the operation of the charge pump of the voltage generator 160c of FIG. 4. The operations of the first pumping stage PS1 and the second pumping stage PS2 will be described below with reference to FIG. 5.

Hereinafter, operations of the first pumping stage PS1 and the second pumping stage PS2 will be described through first to fourth periods. A first period is a period indicated by 1 in FIG. 5, a second period is a period indicated by 2 in FIG. 5, a third period is a period indicated by 3 in FIG. 5, and a fourth period is a period indicated by 4 in FIG. 5.

[First Period]

The first period may be defined as a period in which the first main clock CK00 is at a high level, the first sub-clock CK00B is at a low level, the second main clock CK00B is at the low level, and the second sub-clock CK00 is at the high level. In the first period, the first transistor M1 and the third transistor M3 are turned off, and the second transistor M2 and the fourth transistor M4 are turned on. Also, in the first period, a fifth transistor M5 and a seventh transistor M7 are turned on, and a sixth transistor M6 and an eighth transistor M8 are turned off. Accordingly, the voltage charged in the first capacitor C1 is discharged and provided to the second pumping stage PS2 as the first output voltage VOUT_P. The first output voltage VOUT_P provided from the first pumping stage PS1 is charged in the third capacitor C3 through the fifth transistor M5. At this time, the input voltage VIN applied to the input terminal IN_ND may be charged in the second capacitor C2 through the second transistor M2, and the voltage charged in the fourth capacitor C4 may be discharged and provided to the output terminal OUT_ND as the second output voltage VOUT.

[Second Period]

In the second period, as compared to the first period, while phases of the first main clock CK00 and the first sub-clock CK00B are maintained, the second main clock CK00B becomes a high level and the second sub-clock CK00 becomes a low level. Therefore, the fifth transistor M5 and the seventh transistor M7 are turned off, and the sixth transistor M6 and the eighth transistor M8 are turned on. Therefore, the voltage charged in the third capacitor C3 is discharged and provided to the output terminal OUT_ND as the second output voltage VOUT. At this time, the first output voltage VOUT_P may be charged in the fourth capacitor C4 through the sixth transistor M6.

[Third Period]

In the third period, as compared to the second period, while phases of the second main clock CK00B and the second sub-clock CK00 are maintained, the first main clock CK00 becomes a low level and the first sub-clock CK00B becomes a high level. Therefore, the first transistor M1 and the third transistor M3 are turned on, and the input voltage VIN applied to the input terminal IN_ND is charged in the first capacitor C1 through the first transistor M1, and the voltage charged in the second capacitor C2 is discharged and provided to the second pumping stage PS2 as the first output voltage VOUT_P. Meanwhile, at this time, since the sixth transistor M6 is turned on, the first output voltage VOUT_P provided from the first pumping stage PS1 is charged in the fourth capacitor C4 through the sixth transistor M6.

[Fourth Period]

In the fourth period, as compared to the third period, while phases of the first main clock CK00 and the first sub-clock CK00B are maintained, the second main clock CK00B becomes a low level and the second sub-clock CK00 becomes a high level. Therefore, the sixth transistor M6 and the eighth transistor M8 are turned off, and the fifth transistor M5 and the seventh transistor M7 are turned on. Therefore, the voltage charged in the fourth capacitor C4 is discharged and provided to the output terminal OUT_ND as the second output voltage VOUT. At this time, the first output voltage VOUT_P may be charged in the third capacitor C3 through the fifth transistor M5.

As described above, as first and second main clocks CK00 and CK00B and first and second sub-clocks CK00B and CK00 are toggled, the operations of the first to fourth periods are repeatedly performed, and thus the second output voltage VOUT provided to the output terminal OUT_ND may be charged in an output capacitor COUT and provided as a final output voltage.

Figure 6:
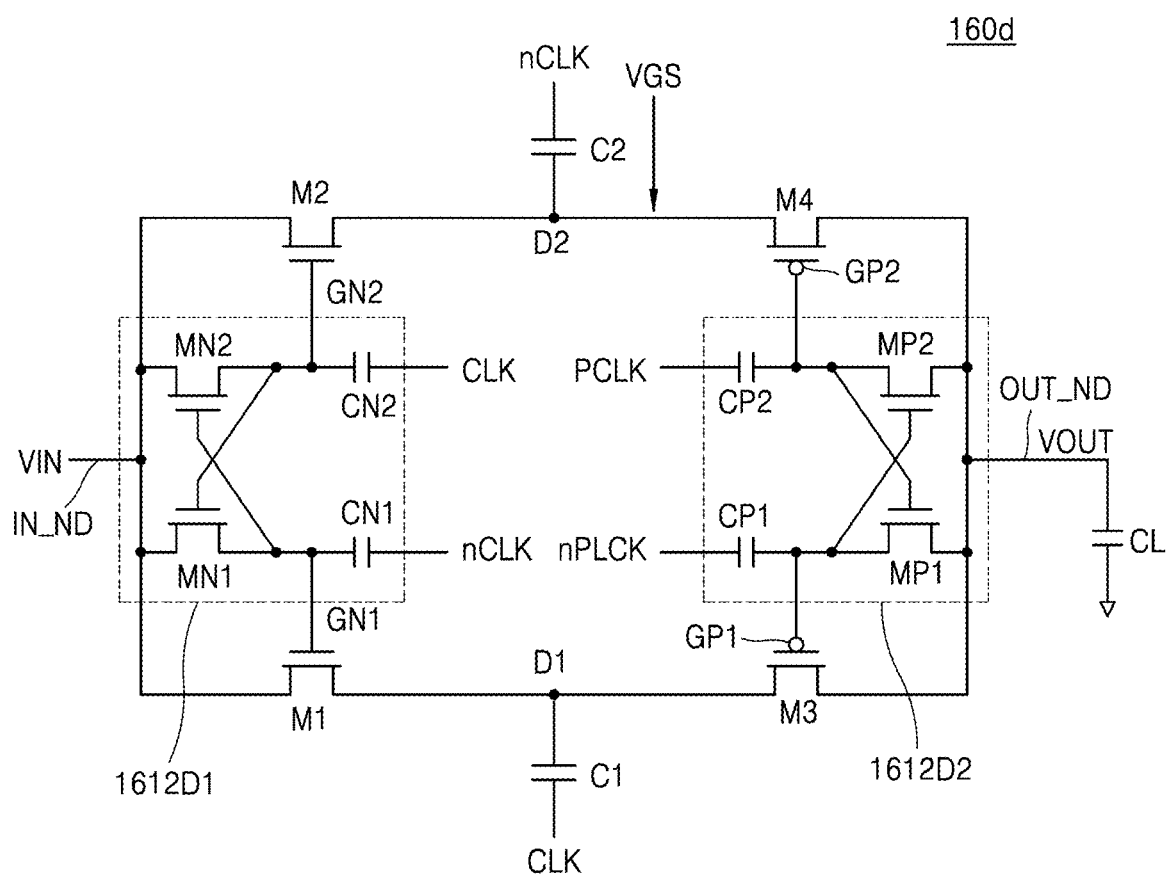
FIG. 6 is a circuit diagram of a charge pump in a voltage generator according to some example embodiments.

FIG. 6 is a diagram showing an example of a circuit of a charge pump included in a voltage generator according to some example embodiments.

Referring to FIG. 6, a charge pump of a voltage generator 160d may include CTS M1, M2, M3, and M4, pumping capacitors C1 and C2, a first gate control unit 1612D1, and a second gate control unit 1612D2. According to some example embodiments, the charge pump of the voltage generator 160d of FIG. 6 may be another example embodiment of the Pelliconi pump.

The charge pump of the voltage generator 160d may include the first transistor M1 between an input terminal IN_ND receiving the input voltage VIN and a first node D1, the second transistor M2 between the input terminal VIN and a second node D2, the third transistor M3 between the first node D1 and an output terminal OUT_ND for outputting an output voltage VOUT, the fourth transistor M4 between the second node D2 and the output terminal, the first capacitor C1 connected between the first node D1 and a first clock terminal for receiving a first clock signal CLK, and the second capacitor C2 connected between the second node D2 and a second clock terminal for receiving a first inverted clock signal nCLK, which is generated by inverting the first clock signal CLK. Also, the charge pump of the voltage generator 160d may include the first gate control unit 1612D1 that controls gates GN1 and GN2 of first and second transistors M1 and M2 by using the first clock signal CLK and the first inverted clock signal nCLK, the second gate control unit 1612D2 that controls gates GP1 and GP2 of third and fourth transistors M3 and M4 by using a second clock signal PCLK and a second inverted clock signal nPCLK, and a load capacitor CL connected between the output terminal OUT_ND and a ground terminal.

Gates of CTS M1 and M2 are controlled by the first gate control unit 1612D1 including a pair of NMOS transistors MN1 and MN2 cross-coupled together with boosting capacitors CN1 and CN2. According to some example embodiments, the first gate control unit 1612D1 includes the first boosting capacitors CN1 and CN2 that are connected to the gates GN1 and GN2 of the first and second transistors M1 and M2 and receive the first clock signal CLK and the first inverted clock signal nCLK and the pair of NMOS transistors MN1 and MN2 cross-coupled between the gates GN1 and GN2 of the first and second transistors M1 and M2 and the input terminal IN_ND.

According to an example, the first gate control unit 1612D1 and the second gate control unit 1612D2 may be gate pumping capacitors 1612 included in a pumping capacitor unit 161 described later with reference to FIG. 8A.

When it is assumed that all nodes are initially 0V, when the first clock signal CLK becomes "HIGH", the voltage level of the second node D2 becomes that of the power voltage VDD. The node GN2 is charged to a value VDD-Vt obtained by subtracting a threshold voltage Vt of the CTS M2 from the power voltage VDD. When the first inverted clock signal nCLK is "HIGH", the second clock signal PCLK is "LOW", and the node D2 is connected to VOUT through the transistor M4 by a high gate-source voltage VGS.

Similarly, gates of the CTS M3 and M4 are controlled by the second gate control unit 1612D2 including a pair of PMOS transistors MP1 and MP2 cross-coupled together with second boosting capacitors CP1 and CP2. According to some example embodiments, the second gate control unit 1612D2 includes the second boosting capacitors CP1 and CP2 that are connected to gates GP1 and GP2 of the third and fourth transistors M3 and M4 and receive the second clock signal PCLK and the second inverted clock signal nPCLK and the pair of PMOS transistors MP1 and MP2 cross-coupled between the gates GP1 and GP2 of the third and fourth transistors M3 and M4 and the output terminal.

The charge pump circuit of the voltage generator 160d according to the example embodiment of FIG. 6 may reduce switch resistances of PMOS CTS and NMOS CTS by maintaining high overdrive voltages.

In the example embodiments shown in FIGS. 4 to 6, a charge pump circuit in a voltage generator including a pumping capacitor, a gate pumping capacitor and a charge transfer switch has been described. According to the example embodiment of FIG. 7, a charge pump circuit may further include a clock driver and a HV TR.

Figure 7:
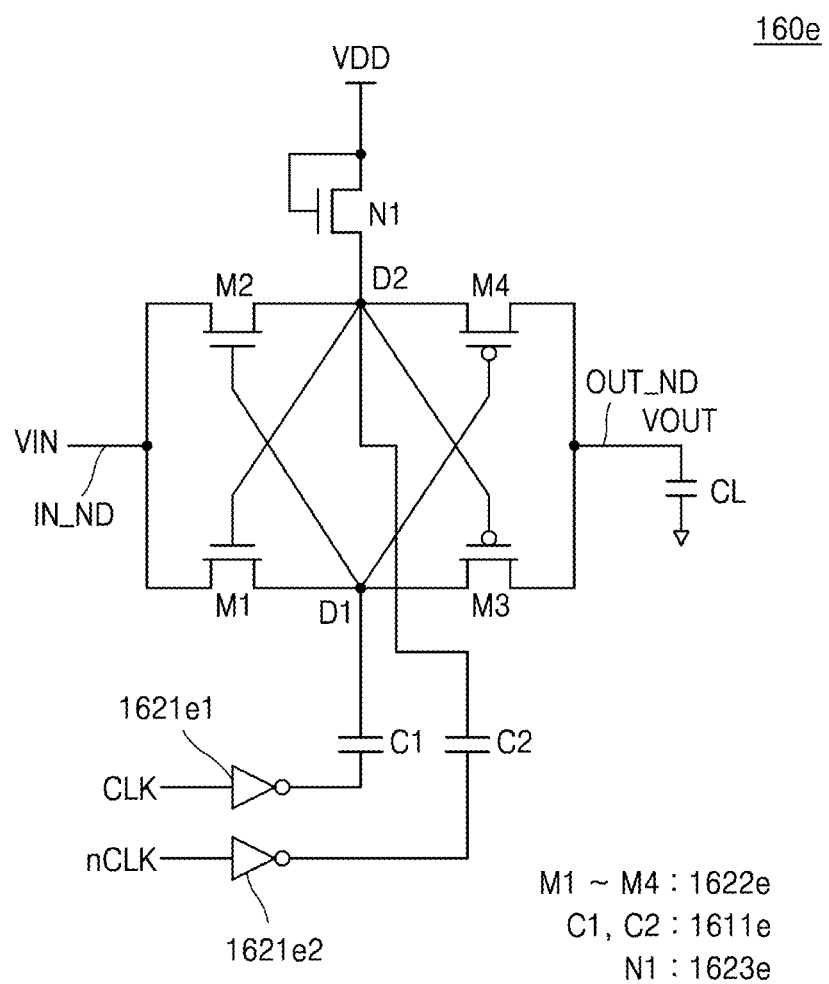
FIG. 7 is a circuit diagram of a charge pump in a voltage generator according to some example embodiments.

FIG. 7 is a circuit diagram showing an example of a charge pump circuit in a voltage generator according to some example embodiments.

Referring to FIG. 7, the charge pump of a voltage generator 160e includes the first transistor M1 between an input terminal IN_ND receiving the input voltage VIN and a first node D1, the second transistor M2 between the input terminal IN_ND and a second node D2, the third transistor M3 between the first node D1 and an output terminal OUT_ND for outputting an output voltage VOUT, the fourth transistor M4 between the second node D2 and the output terminal OUT_ND, the first capacitor C1 connected between the first node D1 and a first clock terminal for receiving a first clock signal CLK, and the second capacitor C2 connected between the second node D2 and a second clock terminal for receiving a first inverted clock signal nCLK, which is generated by inverting the first clock signal CLK. Also, the charge pump of the voltage generator 160e may include a first clock driver 1621e1 connected to the first capacitor C1, a second clock driver 1621e2 connected to the second capacitor C2, and a HV TR N1 connected between an operating voltage Vdd and the second node D2. According to an example, the HV TR N1 may be an NMOS transistor.

According to an example, first and second clock drivers 1621e1 and 1621e2 may be provided in the form of inverters. According to an example, the first and second clock drivers 1621e1 and 1621e2 may include an NMOS transistor and a PMOS transistor. The first and second clock drivers 1621e1 and 1621e2 may receive a clock signal from an oscillator (not shown). The first and second clock drivers 1621e1 and 1621e2 may invert clock signals and transfer inverted clock signals to the pumping capacitors C1 and C2.

According to an example, the HV TR N1 may be connected between the power voltage VDD and the second node D2. A gate terminal and a drain terminal of the HV TR N1 may be connected to the power voltage VDD, and a source terminal of the HV TR N1 may be connected to the second node D2. The HV TR N1, which is an NMOS transistor, pre-charges the second node D2 with charges corresponding to the power voltage VDD. For example, when the threshold voltage of the HV TR N1, which is an NMOS transistor, is Vth, charges corresponding to Vdd-Vth are pre-charged in the second node D2. In other words, when the HV TR N1 is included, the reference voltage may be increased through the pre-charging of charges, and thus charge pumping may be performed more efficiently. According to an example, the HV TR N1 may pre-charge the charge pump. According to an example, the HV TR N1 may pre-charge the pumping capacitor unit to a certain voltage, and the certain voltage may be the power voltage VDD or an external voltage.

For convenience of explanation, a gate pumping capacitor is omitted in the example embodiment of FIG. 7. However, it would be obvious that the gate pumping capacitor of FIG. 6 may be added to the circuit of the example embodiment of FIG. 7.

FIGS. 3 to 7 are diagrams showing examples of charge pump circuits that may be included in a voltage generator. However, the configurations of the charge pump circuits are not limited to those shown in FIGS. 3 to 7, and modifications may be made in connection structures or additional components may be employed.

Referring to FIGS. 2 to 7, a charge pump of a voltage generator according to an example may include the pumping capacitor unit 161 including a pumping capacitor 1611 and a gate pumping capacitor 1612 and may include a signal controller 162 including a clock driver 1621, a CTS 1622, and a HV TR 1623. According to some example embodiments, the layout arrangement structure according to FIGS. 8A to 12B, which will be described later, may be diagrams for describing layouts when the charge pump circuit in the voltage generator shown in FIGS. 3 to 7 is actually disposed on a substrate.

Figure 8A:
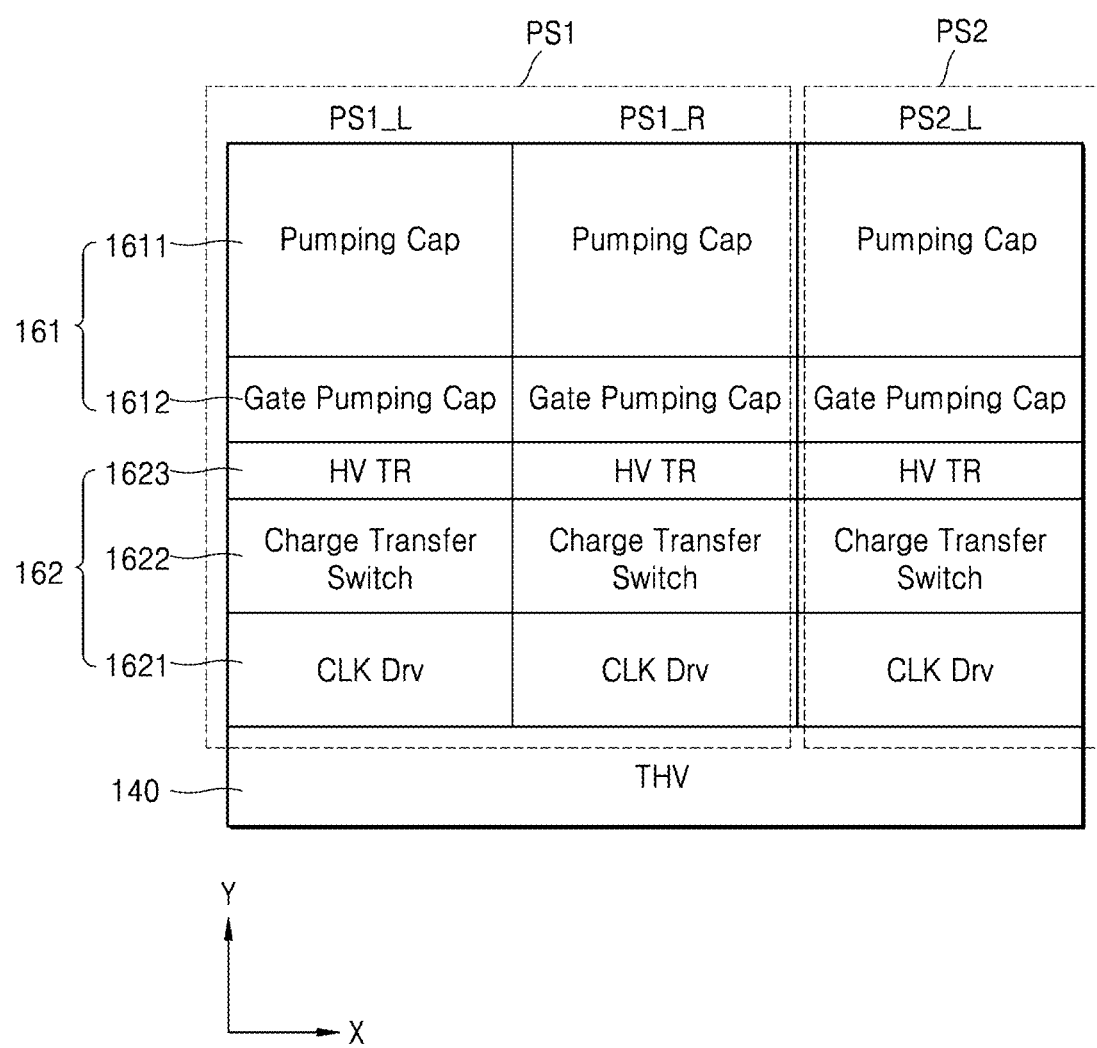
FIGS. 8A to 8C are diagrams for describing layout structures of a charge pump in a voltage generator according to some example embodiments.

FIG. 8A is a diagram for describing a layout structure of a charge pump in a voltage generator according to some example embodiments.

Referring to FIG. 8A, a charge pump of a voltage generator may include a plurality of pumping stages, e.g., the first pumping stage PS1 and the second pumping stage PS2. The first pumping stage PS1 may be divided into a left pumping stage PS1_L and a right pumping stage PS1_R. The second pumping stage PS2 may be divided into a left pumping stage PS2_L and a right pumping stage (not shown). The right pumping stage (not shown) of the second pumping stage PS2 may be disposed adjacent to the left pumping stage PS2_L of the second pumping stage PS2 in the X-axis direction.

Referring to FIG. 4, some example embodiments in which the first pumping stage PS1 includes the four CTS M1, M2, M3, and M4 and the two pumping capacitors C1 and C2 is provided. Also, the pumping capacitors C1 and C2 may receive complementary clock signals, respectively.

A cross-coupled type pumping stage as shown in FIG. 4 includes two pumping capacitors and four CTS, and charging/discharging may be repeated according to a clock signal applied to each pumping capacitor. To easily explain this, one pumping stage may be divided into a left pumping stage and a right pumping stage. Referring to FIG. 4, the left pumping stage PS1_L may include CTS M1 and M4 and a pumping capacitor C1, and the right pumping stage PS2_R may include CTS M2, M3 and a pumping capacitor C2. The left pumping stage PS1_L and the right pumping stage PS1_R according to the example embodiment of FIG. 8A may be cross-coupled charge pumps that complementarily operate according to clock signals.

Since the same principle is applied the first pumping stage PS1 and the second pumping stage PS2, the arrangement structure thereof will be described with reference to the first pumping stage PS1 below. The description of the arrangement structure of the first pumping stage PS1 may be equally applied to the arrangement structure of the second pumping stage PS2. Also, although the first pumping stage PS1 includes the left pumping stage PS1_L and the right pumping stage PS1_R, they have the same structure, and thus descriptions will be given below based on the left pumping stage PS1_L.

The first pumping stage PS1 and the second pumping stage PS2 may be arranged side-by-side in the X-axis direction. According to an example, the first pumping stage PS1 and the second pumping stage PS2 may be sequentially arranged in the X-axis direction from a low stage. Although two pumping stages, that is, the first pumping stage PS1 and the second pumping stage PS2, are shown in FIG. 8A, the number of pumping stages that the voltage generator 160 may include may be three or more.

Figure 14:
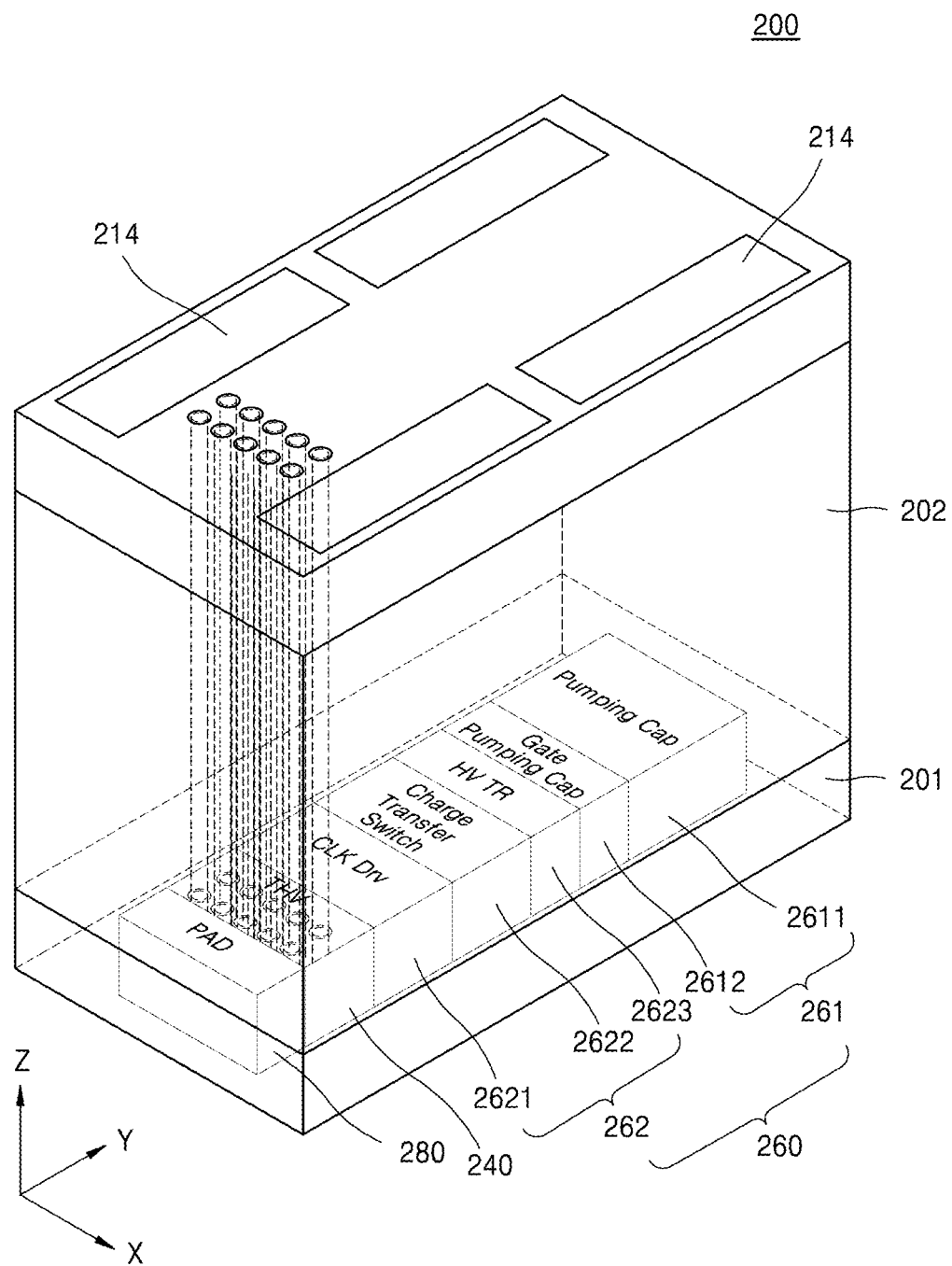
FIG. 14 is a cross-sectional view of an example of a memory device according to some example embodiments.

According to an example, the first pumping stage PS1 and the second pumping stage PS2 may be arranged in a direction in which a THV 140 extends. According to some example embodiments, the first pumping stage PS1 and the second pumping stage PS2 may be arranged to proceed in a direction (X-axis direction) perpendicular to a direction to which power is applied (Y-axis direction). According to some example embodiments, the direction in which the pump power is applied (Y-axis direction) may be a direction perpendicular to the direction in which the THV 140 extends (X-axis direction). According to some example embodiments, the THV 140 may be disposed to extend in the X-axis direction. Referring to FIG. 14 to be described later, the THV 140 may be a path that electrically connects a peripheral circuit region and a memory cell region.

According to some example embodiments, components of the pumping stages PS1 and PS2 may be arranged in the Y-axis direction perpendicular to the THV 140 extending in the X-axis direction. Based on the Y-axis direction, the signal controller 162 may be disposed first in a direction away from the THV 140, and then the pumping capacitor unit 161 may be disposed.

The left pumping stage PS1_L may include the pumping capacitor unit 161 and the signal controller 162. According to some example embodiments, the pumping capacitor unit 161 may include the pumping capacitor 1611 and the gate pumping capacitor 1612. According to some example embodiments, the signal controller 162 may include the clock driver 1621, the charge transfer switch 1622, and the HV TR 1623.

Referring to FIG. 8A, the clock driver 1621 may be disposed adjacent to the THV 140 in the Y-axis direction. According to some example embodiments, in the signal controller 162, the clock driver 1621 may be disposed at a position closest to the THV 140 in the Y-axis direction.

According to some example embodiments, the CTS 1622, the clock driver 1621, and the HV TR 1623 included in the signal controller 162 and the pumping capacitor 1611 and the gate pumping capacitor 1612 included in the pumping capacitor unit 161 may be arranged at a constant distance from the THV 140 in the Y-axis direction. According to some example embodiments, the layout of the components included in the signal controller 162 and the layout of the components included in the pumping capacitor unit 161 may be 2-dimensionally arranged.

Figure 8B:
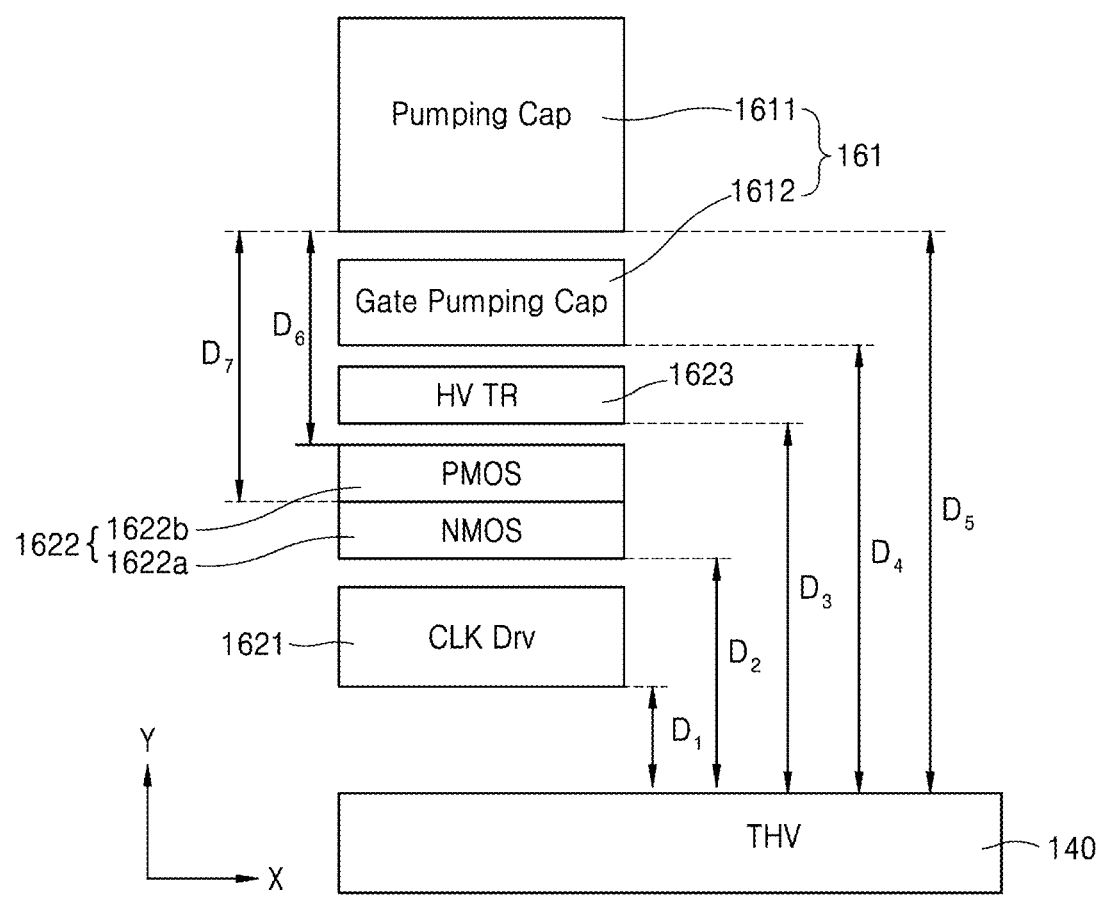

Referring to FIG. 8B, an arrangement structure in a pumping stage will be described in more detail.

Referring to FIG. 8B, a distance D1 between the THV 140 and the clock driver 1621 in the Y-axis direction may be smaller than a distance D2 between the THV 140 and the CTS 1622 in the Y-axis direction. The distance D1 between the THV 140 and the clock driver 1621 in the Y-axis direction may be smaller than a distance D4 between the THV 140 and the pumping capacitor unit 161.

According to some example embodiments, all distances from the first pumping stage PS1 and the second pumping stage PS2 to the THV 140 may be the same. According to some example embodiments, positions of clock drivers 1621 in the first pumping stage PS1 and the second pumping stage PS2 may be located at the distance D1 equally from the THV 140. According to some example embodiments, each of the first pumping stage PS1 and the second pumping stage PS2 includes the clock driver 1621, and distances between the clock drivers 1621 in the first pumping stage PS1 and the second pumping stage PS2 and the THV 140 may be the same, that is, the distance D1. According to some example embodiments, the distance D1 may be 0. The distance between the clock driver 1621 and the THV 140 is reduced, thereby reducing the resistance against an applied power.

According to an example, the component disposed closest to the THV 140 in the Y-axis direction may be the clock driver 1621. According to some example embodiments, the clock driver 1621 may receive power through the THV 140. The clock driver 1621 may generate a clock signal by using power applied through the THV 140, and apply the clock signal to the pumping capacitor unit 161. As the distance between the THV 140 through which power is applied and the clock driver 1621 is closer, the resistance value decreases, thereby minimizing or reducing an IR drop. In other words, the efficiency of a voltage generator may be increased through a structure in which the clock driver 1621 and the THV 140 are disposed adjacent to each other.

According to some example embodiments, the clock driver 1621 included in the left pumping stage PS1_L and the clock driver 1621 included in the right pumping stage PS1_R may generate clock signals of opposite levels. According to some example embodiments, when a signal generated by the clock driver 1621 included in the left pumping stage PS1_L becomes "High", a signal generated by the clock driver 1621 included in the right pumping stage PS1_R may be "LOW". According to some example embodiments, the clock driver 1621 included in the right pumping stage PS1_R and the clock driver 1621 included in the left pumping stage PS2_L in the second pumping stage in the second pumping stage PS2 may generate clock signals of the same level. According to some example embodiments, when a signal generated by the clock driver 1621 included in the right pumping stage PS1_R is "LOW", a signal generated by the clock driver 1621 included in the left pumping stage PS2_L in the second pumping stage PS2 may be "LOW". In other words, output levels of clock drivers may be adjusted to minimize or reduce a case in which phases of clock signals generated by adjacent pumping stages are opposite to each other.

According to some example embodiments, previously, adjacent clock drivers repeatedly output high clock signals and low clock signals, and, when it is assumed that there are 8 pumping stages, clock signals may be output in the order of HLHLHLHL. In this case, clock signals having phases opposite to each other are generated 7 times.

When it is assumed that there are 8 pumping stages, clock drivers may output clock signals in the order of HLLHHLLH. In this case, clock signals having phases opposite to each other are generated 4 times. Parasitic capacitor components may be minimized or reduced by minimizing or reducing the case where phases of clock signals are opposite to each other.

According to some example embodiments, the clock driver 1621, the CTS 1622, and the HV TR 1623 may be arranged in the signal controller 162. According to some example embodiments, the component closest to the THV 140 in the Y-axis direction in the signal controller 162 may be the clock driver 1621, and the component farthest from the THV 140 in the Y-axis direction in the signal controller 162 may be the HV TR 1623. According to some example embodiments, since the pumping capacitor unit 161 may be a high voltage device, a body voltage of the HV TR 1623 may be set to a GND voltage, and, by arranging the pumping capacitor unit 161 and the HV TR 1623 close to each other, bodies thereof may share the GND voltage, and thus the body share effect may be obtained. Therefore, the chip size reduction (CSR) effect may also be obtained.

According to some example embodiments, when the charge pump circuit includes the gate pumping capacitor 1612 as in the example embodiment of FIG. 6, the gate pumping capacitor 1612 may be disposed after the signal controller 162 is disposed. In other words, the gate pumping capacitor 1612 may be disposed adjacent to the signal controller 162 in the Y-axis direction. Therefore, it is possible to minimize or reduce a routing area for the gate pumping capacitor 1612, thereby maximizing or improving the area of a Metal-Insulator-Metal (MIM) capacitor.

Referring to FIG. 8B, the CTS 1622 may include an NMOS transistor 1622a and a PMOS transistor 1622b. Referring to FIG. 8B, the NMOS transistor 1622a included in the CTS 1622 may be disposed adjacent to the clock driver 1621 in the Y-axis direction, and the PMOS transistor 1622b included in the CTS 1622 may be disposed adjacent to the HV TR 1623 in the Y-axis direction. According to some example embodiments, a distance D6 between the pumping capacitor 1611 and the PMOS transistor 1622b included in the CTS 1622 may be smaller than a distance d7 between the pumping capacitor 1611 and the NMOS transistor 1622a included in the CTS 1622. According to some example embodiments, since the pumping capacitor 1611 is charged through the NMOS transistor 1622a and a charged voltage is transferred through the PMOS transistor 1622b, by disposing the PMOS transistor 1622b of the CTS 1622 close to the pumping capacitor unit 161, resistance in a current path and parasitic resistance may be minimized or reduced.

According to some example embodiments, a metal line (not shown) for power transfer may be included in the first pumping stage PS1. According to some example embodiments, a metal having a small sheet resistance may be disposed in the same direction as the Y-axis direction in which power is applied. According to some example embodiments, a metal having a large sheet resistance may be disposed in the same direction as the X-axis direction, which is a moving direction of the first pumping stage PS1. To reduce the resistance inside pumplines of a metal having a small sheet resistance may be arranged in the Y-axis direction. Therefore, routing resistance may be minimized or reduced.

According to some example embodiments, power may be applied to the clock driver 1621 inside the first pumping stage PS1. According to some example embodiments, power applied to the clock driver 1621 may be applied from an electrode pad (not shown) connected to the THV 140. Alternatively, according to some example embodiments, power applied to the clock driver 1621 may be applied from an external electrode connected to the THV 140. According to some example embodiments, the first pumping stage PS1 and the second pumping stage PS2 may receive power through separate power lines, respectively. According to some example embodiments, when n pumping stages are provided, n clock drivers may be provided and n power lines may be provided. According to some example embodiments, all of n power lines may have the same length. Therefore, even when there are a plurality of pumping stages, there is no accumulation of resistance for each pumping stage, and thus the efficiency of a charge pump may be improved.

Indicators that may improve the performance of a charge pump for the same charge pump size may include power resistance, resistance at major nodes in a charge pump, and the efficiency of a pumping capacitor. By applying the above-described arrangement structure to a charge pump, power resistance and resistance in the charge pump may be reduced, and thus the performance of the charge pump may be improved.

By setting the power lines of charge pumps of pumping stages to have the same length, the IR drop of power between the charge pumps may be equalized, thereby minimizing or reducing the influence of the IR drop. According to an example, equal IR drops may occur in all pumping stages.

A structure in which the clock driver 1621 is disposed first, that is, closest to the THV 140, based on a direction in which power is applied is disclosed. Therefore, IR drop may be minimized or reduced, and the usable area of an MIM capacitor may be maximized or improved as the area of a metal for power routing (PWR Routing) is minimized or reduced. Also, by disposing the HV TR 1623 adjacent to the pumping capacitor unit 161, an area of charge pump circuit may be minimized or reduced without separating an additional well.

Figure 8C:
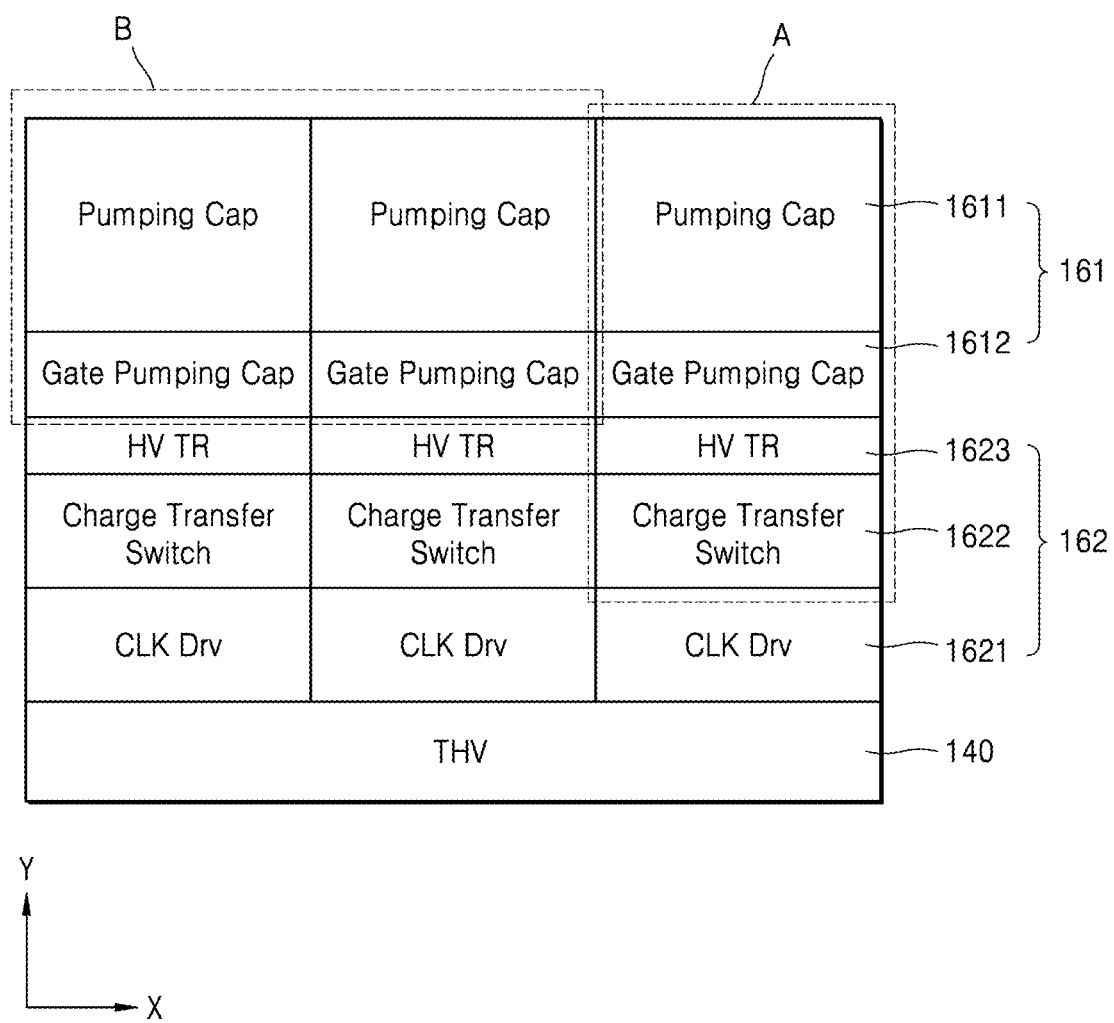

FIG. 8C is a diagram for describing an effect according to a layout structure of a charge pump of a voltage generator according to some example embodiments.

From among indicators related to the performance improvement of a charge pump, in the case of the efficiency of a pumping capacitor, when a ratio of MIM capacitors included in the pumping capacitor unit is increased, the current efficiency is increased. Therefore, when the ratio of MIM capacitors from among capacitors included in a charge pump is increased, the efficiency of the charge pump may be improved.

Referring to FIG. 8C, a region A and a region B are shown. The region A may be a region including the pumping capacitor 1611, the gate pumping capacitor 1612, the HV TR 1623, and the CTS 1622. The region B may be a region including the pumping capacitor 1611 and the gate pumping capacitor 1612. According to some example embodiments, MIM capacitors may be included in the region A. According to some example embodiments, MIM capacitors may also be included in the region B.

According to some example embodiments, since a metal to which power may be applied is connected to the clock driver 1621, an MIM capacitor may not be disposed in a region where the clock driver 1621 is disposed. In other words, MIM capacitors may be arranged in regions other than a region in which the clock driver 1621 is disposed. According to some example embodiments, MIM capacitors may be included and arranged in the region A, which is a region without the clock driver 1621. However, according to some example embodiments, MIM capacitors may be included and arranged only in the region B, which constitutes a pumping capacitor unit.

By disposing the clock driver 1621 close to the THV 140, a metal to which power is applied only passes a region overlapping the clock driver 1621. Therefore, since no metal passes over through an upper portion of the pumping capacitor unit 161, an area for using MIM capacitors may be secured. Also, since an area through which the metal passes may be minimized or reduced, the area to which MIM capacitors may be applied may be increased.

According to some example embodiments, in the case of an HV depletion (HVD) capacitor, the efficiency thereof is deteriorated due to parasitic capacitor components, and thus, when the ratio of MIM capacitors is increased, the efficiency of the HVD capacitor may be increased.

The arrangement structure of a charge pump in a voltage generator may be an arrangement of the components in the charge pump optimized or improved in consideration of distances from a power line, arrangement of transistors having the same well bias, etc.

In the example embodiment of FIGS. 8A to 8C, the voltage generator has the configuration of the charge pump according to the example embodiment of FIG. 4. However, a voltage generator may also have the configuration of the charge pump according to the example embodiment of FIG. 3.

According to an embodiment, when a voltage generator has the charge pump according to the example embodiment of FIG. 3, in the example embodiment of FIG. 8A, a single pumping stage may be provided without dividing the pumping stage into a left pumping stage and a right pumping stage. According to some example embodiments, when a voltage generator has the configuration of the charge pump according to the example embodiment of FIG. 3, in the example embodiment of FIG. 8B, a CTS does not include both a PMOS and an NMOS and may include either one PMOS or one NMOS. When a voltage generator has the configuration of the charge pump according to the example embodiment of FIG. 3, an arrangement structure other than the above-described differences may be the same as those in the example embodiments of FIGS. 8A to 8C.

Figure 9:
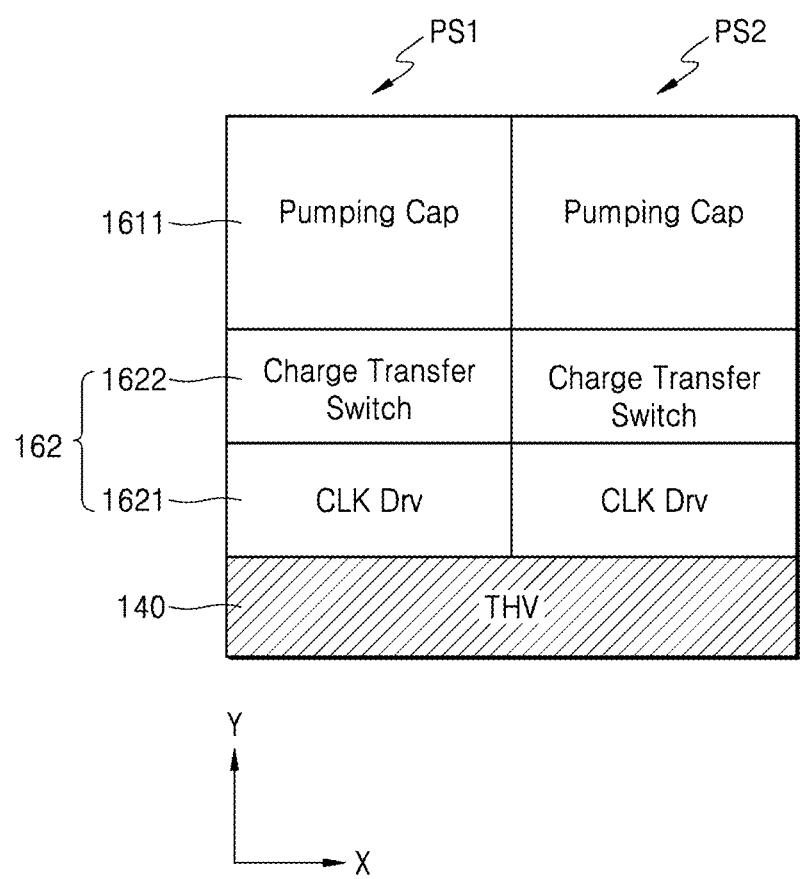
FIG. 9 is a diagram for describing a layout structure of a charge pump in a voltage generator according to some example embodiments.

FIG. 9 is a diagram for describing a layout structure of a charge pump in a voltage generator according to some example embodiments. According to some example embodiments, as compared to the voltage generator of FIG. 8A, a voltage generator that does not include a gate pumping capacitor and a HV TR may be provided. An example of the layout of such a voltage generator is shown in FIG. 9.

In the example embodiments of FIGS. 9 to 12B below, descriptions identical to those already given above with reference to FIGS. 8A to 8C will be omitted.

Referring to FIG. 9, the clock driver 1621, the CTS 1622, and the pumping capacitor 1611 may be arranged in the Y-axis direction in the order stated. According to some example embodiments, a distance between the THV 140 and the clock driver 1621 in the Y-axis direction may be smaller than a distance between the THV 140 and each of the other components, that is, the CTS 1622 and the pumping capacitor 1611, in the Y-axis direction. According to some example embodiments, a distance between the THV 140 and the pumping capacitor 1611 in the Y-axis direction may be greater than the distance between the THV 140 and each of the other components, that is, the CTS 1622 and the pumping capacitor 1611, in the Y-axis direction.

Figure 10:
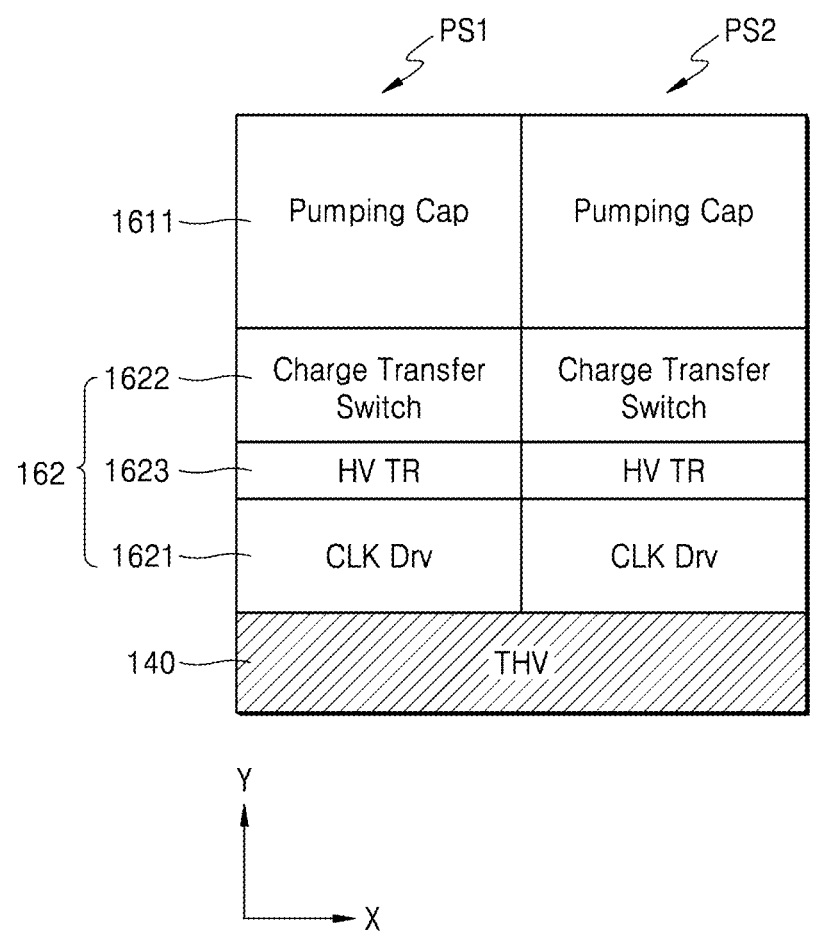
FIG. 10 is a diagram for describing a layout structure of a charge pump in a voltage generator according to some example embodiments.

FIG. 10 is a diagram for describing a layout structure of a charge pump in a voltage generator according to some example embodiments.

According to some example embodiments, as compared to the voltage generator of FIG. 8A, a voltage generator that does not include a gate pumping capacitor may be provided. An example of the layout of such a voltage generator is shown in FIG. 10.

Referring to FIG. 10, the clock driver 1621, the HV TR 1623, the CTS 1622, and the pumping capacitor 1611 may be arranged in the Y-axis direction in the order stated. According to some example embodiments, a distance between the THV 140 and the clock driver 1621 in the Y-axis direction may be smaller than a distance between the THV 140 and each of the other components, that is, the CTS 1622, the HV TR 1623, and the pumping capacitor 1611, in the Y-axis direction. According to some example embodiments, the distance in the Y-axis direction between the THV 140 and the pumping capacitor 1611 may be greater than the distance in the Y-axis direction between the THV 140 and other components 1622, 1623, and 1621. According to some example embodiments, a distance between an NMOS transistor included in the CTS 1622 and the pumping capacitor 1611 in the Y-axis direction may be greater than a distance between a PMOS transistor included in the CTS 1622 and the pumping capacitor 1611 in the Y-axis direction.

According to some example embodiments, when the pumping capacitor 1611 is not a high voltage device or the voltage of the body of the HV TR 1623 is not a ground voltage, the body share effect of the HV TR 1623 and the pumping capacitor 1611 does not occur.

Referring to FIG. 10, an example of the layout of a voltage generator in the case where, because a body voltage is not shared between the pumping capacitor 1611 and the HV TR 1623, the body share effect does not occur is shown. Referring to FIG. 10, the HV TR 1623 may be disposed between the clock driver 1621 and the CTS 1622. Through such an arrangement structure, the distance between the CTS 1622 and the pumping capacitor 1611 may be reduced, and parasitic resistance may be reduced.

Figure 11A:
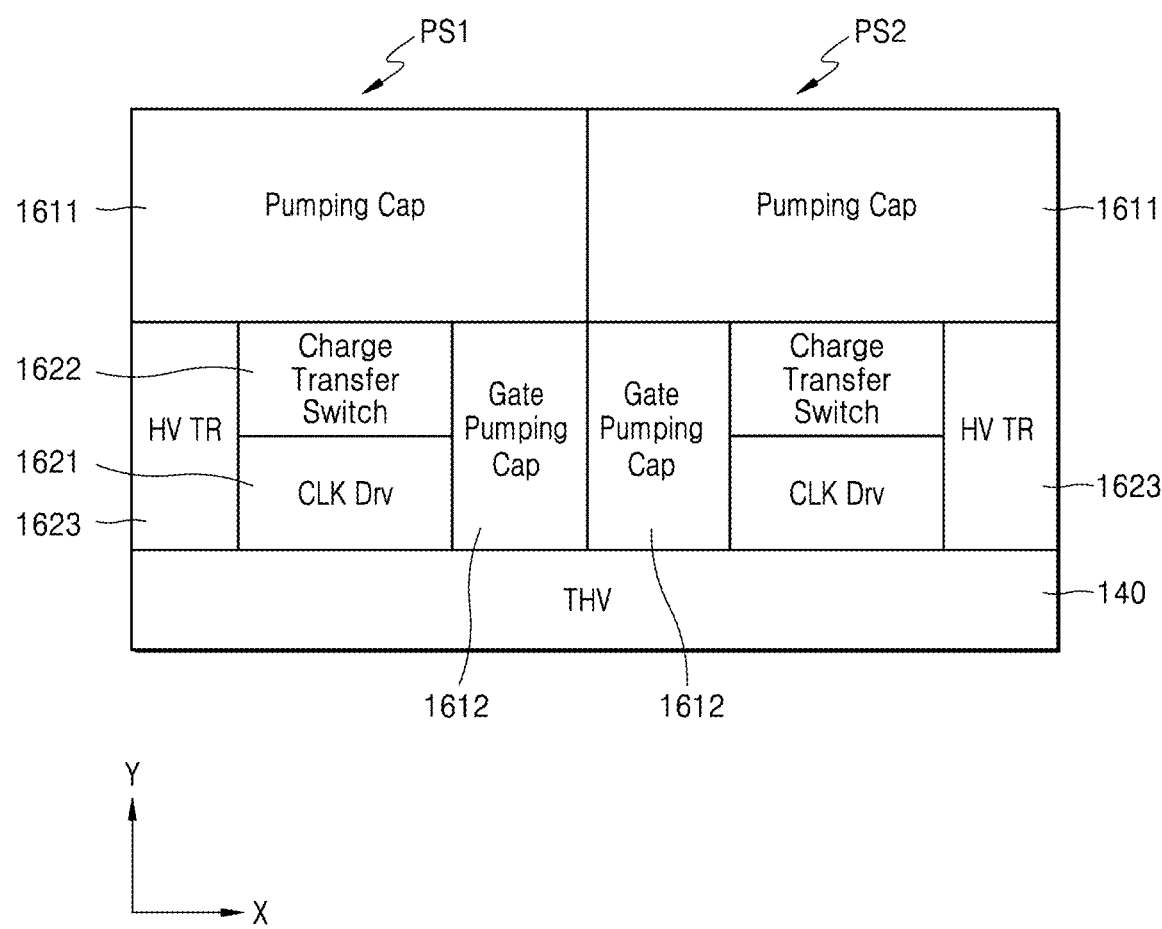
FIGS. 11A and 11B are diagrams for describing layout structures of a charge pump in a voltage generator according to some example embodiments.
Figure 11B:
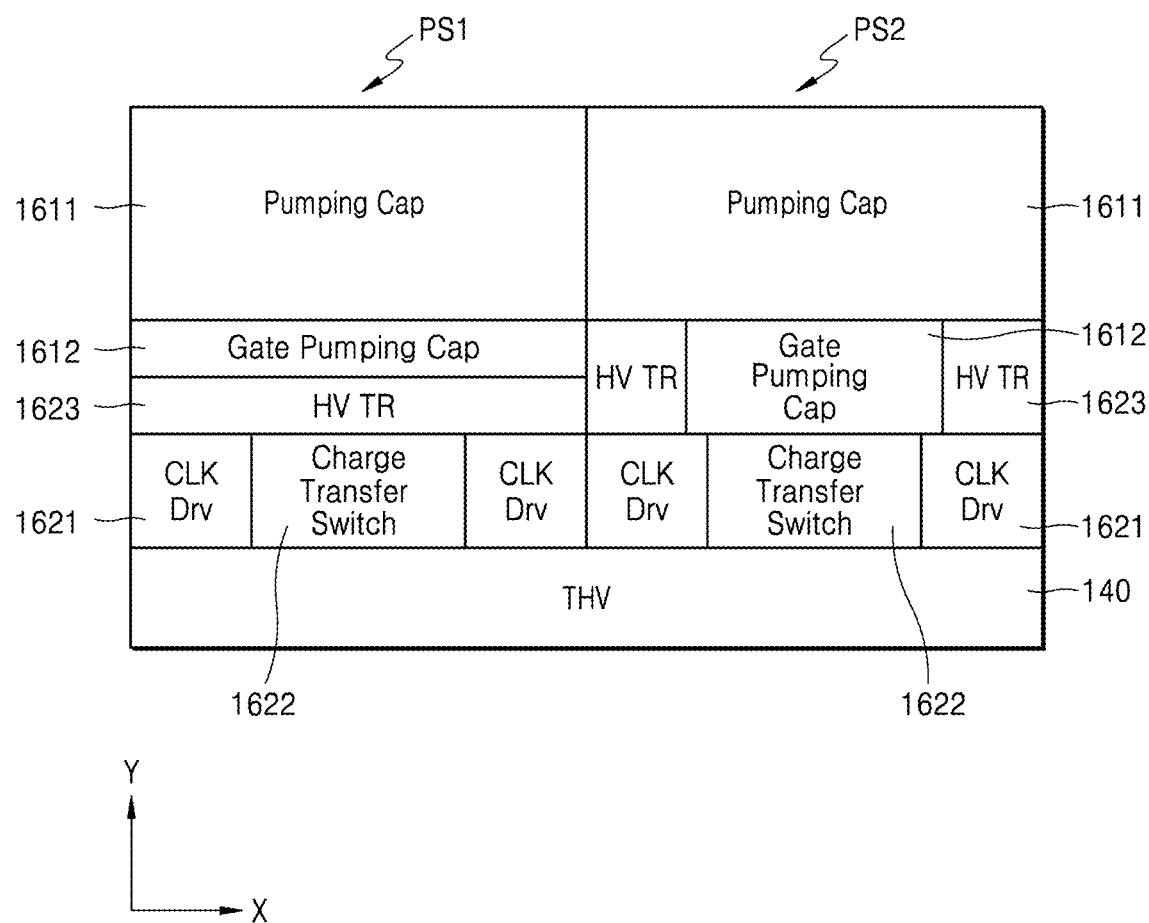

FIGS. 11A and 11B are diagrams for describing layout structures of a charge pump in a voltage generator according to some example embodiments.

According to some example embodiments, the components in the first pumping stage PS1 and the second pumping stage PS2 may not be sequentially arranged in the Y-axis direction. According to an example of FIG. 11A, the THV 140 and the clock driver 1621 may be arranged adjacent to each other. According to the embodiment of FIG. 11A, the CTS 1622 may be disposed adjacent to the clock driver 1621 in the Y-axis direction. In the first pumping stage PS1 according to some example embodiments, the HV TR 1623 may be disposed on the left side with respect to the clock driver 1621 and the CTS 1622. According to some example embodiments, the gate pumping capacitor 1612 may be disposed on the right side with respect to the clock driver 1621 and the CTS 1622. According to some example embodiments, in the embodiment of FIG. 11A, the position of the HV TR 1623 and the position of the gate pumping capacitor 1612 may be interchanged. In the second pumping stage PS2 according to some example embodiments, the gate pumping capacitor 1612 may be disposed on the left side with respect to the clock driver 1621 and the CTS 1622. According to some example embodiments, the HV TR 1623 may be disposed on the right side with respect to the clock driver 1621 and the CTS 1622.

According to some example embodiments, the pumping capacitor 1611 may be disposed adjacent to the HV TR 1623, the CTS 1622, and the gate pumping capacitor 1612 in the Y-axis direction.

According to the embodiment of FIG. 11B, the CTS 1622 and the clock driver 1621 may be arranged adjacent to each other in the X-axis direction. According to the embodiment of FIG. 11B, the HV TR 1623 may be disposed adjacent to the gate pumping capacitor 1612 in the X-axis direction.

In the embodiments of FIGS. 11A to 11B, the clock driver 1621 may be disposed adjacent to the THV 140 to reduce internal resistance, and, by disposing the clock driver 1621 adjacent to the THV 140, it is possible to secure a region in which MIM capacitors may be arranged.

The voltage generator according to the embodiments of FIGS. 11A to 11B may have a relatively reduced length in the Y-axis direction. Therefore, the voltage generator according to the embodiments of FIGS. 11A and 11B may even be applied to the case where a region of a layout having a sufficient length in the Y-axis direction is not secured. The voltage generator according to the embodiment of FIGS. 11A to 11B may be applied when a region having a sufficient length in the X-axis direction is secured.

Although FIGS. 8A to 11 show that both the first pumping stage PS1 and the second pumping stage PS2 adjacent to each other have the same layout structure, the first pumping stage PS1 and the second pumping stage PS2 adjacent to each other may have layout structures different from each other. According to some example embodiments, when it is assumed that there is a charge pump including three pumping stages, a first pumping stage may be disposed to have the structure of the first pumping stage PS1 shown in FIG. 8A, a second pumping stage may be disposed to have the structure of the first pumping stage PS1 shown in FIG. 9, and a third pumping stage may be disposed to have the structure of the structure of the first pumping stage PS1 shown in FIG. 10, wherein modifications may be freely made therein.

Figure 12A:
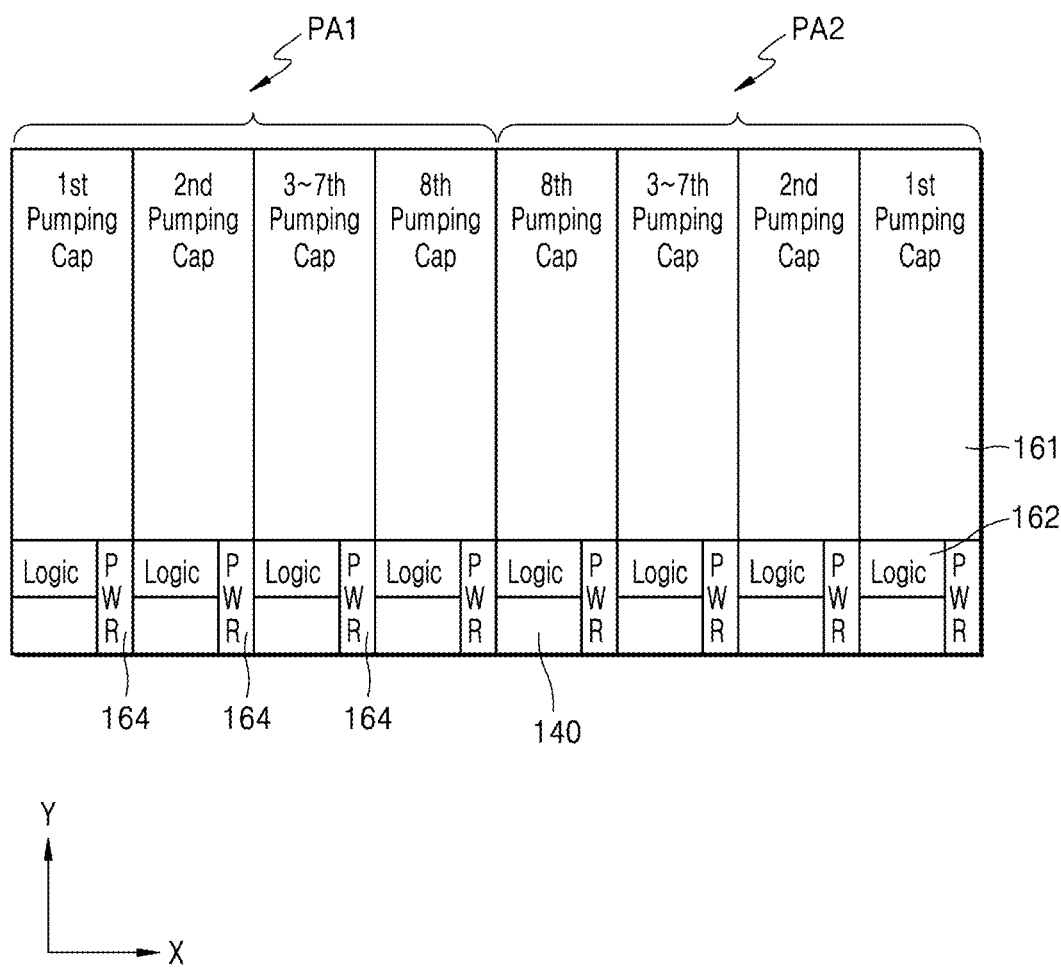
FIGS. 12A and 12B are diagrams for describing layout structures of a charge pump in a voltage generator according to some example embodiments.
Figure 12B:
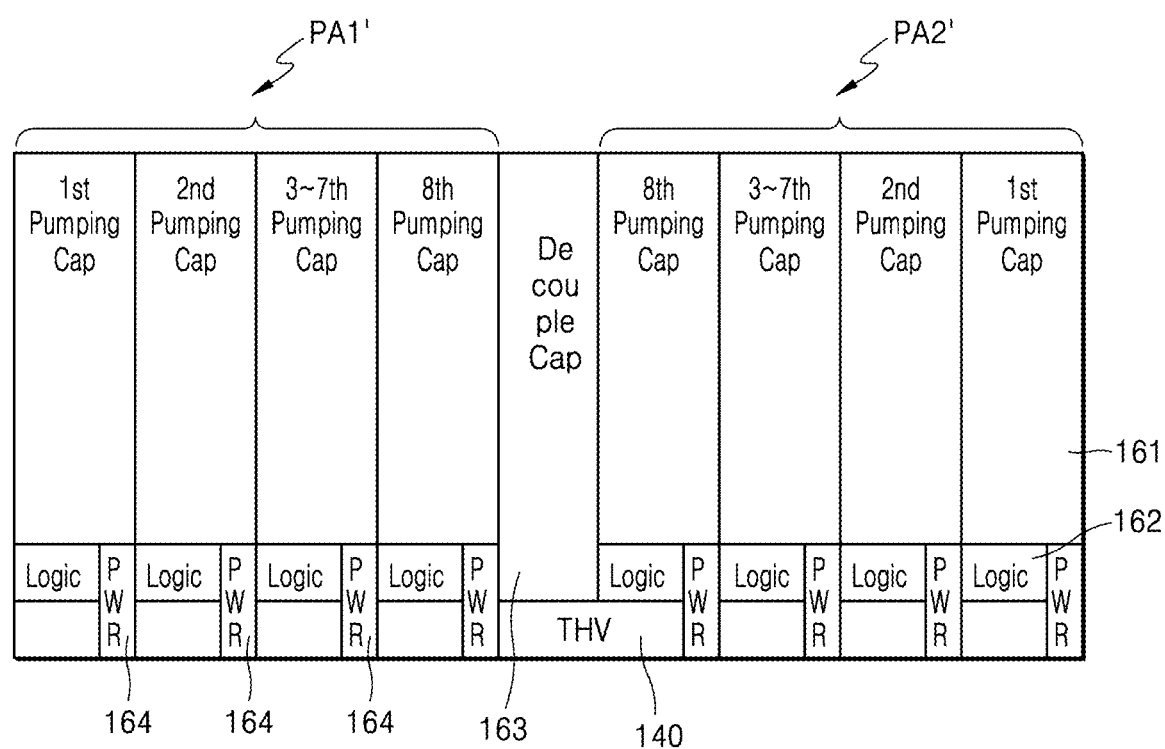

FIGS. 12A and 12B are diagrams for describing layout structures of a charge pump in a voltage generator according to some example embodiments.

According to embodiments of FIGS. 12A to 12B, voltage generators including a plurality of pumping stages, that is, the first pumping stage PS1 and the second pumping stage PS2, are shown. According to the embodiment of FIG. 12A, by changing the layout of a voltage generator including a plurality of pumping stages to a structure in which the pumping stages are symmetrical to each other, a peak current may be separated to increase stability.

According to the embodiment of FIG. 12A, the voltage generator may include a first pumping area PA1 and a second pumping area PA2. According to some example embodiments, the first pumping area PA1 may include a plurality of pumping stages. According to some example embodiments, the second pumping area PA2 may include a plurality of pumping stages. The number of pumping stages included in the first pumping area PA1 may be the same as the number of pumping stages included in the second pumping area PA2. The first pumping area PA1 and the second pumping area PA2 may be provided as symmetrical components.

FIG. 12A shows some example embodiments in which the first pumping area PA1 includes eight pumping stages and the second pumping area PA2 includes eight pumping stages. However, it is merely an example embodiment, and the number of pumping stages that the first pumping area PA1 and the second pumping area PA2 may each include may vary.

According to some example embodiments, each of pumping stages included in the first pumping area PA1 and each of pumping stages included in the second pumping area PA2 may be connected to one THV 140. Each pumping stage may be connected to one THV 140 and receive power 164. According to some example embodiments, a clock driver included in the signal controller 162 may be disposed in a lower region adjacent in the pumping stage in the Y-axis direction. According to some example embodiments, the clock driver included in the signal controller 162 may be disposed adjacent to the THV 140.

According to some example embodiments, a plurality of clock drivers included in the first pumping area PA1 and a plurality of clock drivers included in the second pumping area PA2 may be arranged at the same location. According to some example embodiments, a distance between the clock drivers included in the first pumping area PA1 and the THV 140 may be identical to a distance between the clock drivers included in the second pumping area PA2 and the THV 140.

Referring to FIG. 12A, the first pumping area PA1 and the second pumping area PA2 may be arranged symmetrically (symmetrically around the Y-axis direction). According to some example embodiments, the pumping stage included in the first pumping area PA1 and the second pumping area PA2 may be arranged, such that pumping stages closer to a point at which the first pumping area PA1 and the second pumping area PA2 contact each other, that is, the center of a voltage generator, have greater number of stages. Restated, the concentration of pumping stages increases toward the center of the voltage generator. According to some example embodiments, pumping of the first pumping area PA1 may proceed toward the center of the voltage generator, and pumping of the second pumping area PA2 may also proceed toward the center of the voltage generator.

According to some example embodiments, a common logic region of the signal controller 162 may be issued separately. According to some example embodiments, a logic circuit commonly applied to the first pumping area PA1 and the second pumping area PA2 may be provided as a separate common logic region.

According to some example embodiments, the pumping efficiency may be improved through a structure in which THVs are provided in lower regions of the first pumping area PA1 and the second pumping area PA2 adjacent to each other in the Y-axis direction and clock drivers are provided at locations closest to the THV 140. According to some example embodiments, output resistance and routing may be minimized or reduced through such a horizontally symmetric arrangement, and peak current may be improved.

According to the example of FIG. 12B, the voltage generator may include a decoupling capacitor 163 disposed at the center, a first pumping area PA1' disposed on the left side of the decoupling capacitor 163, and a second pumping area PA2' disposed on the right side of the decoupling capacitor 163. As compared to the voltage generator of FIG. 12A, the voltage generator of FIG. 12B may further include the decoupling capacitor 163 disposed in the central portion. In FIG. 12B, descriptions regarding the same features as those of FIG. 12A will be omitted.

According to some example embodiments, the decoupling capacitor 163 may be connected between a first end of an 8-stage pumping stage of the first pumping area PA1' and a ground GND (not shown). According to some example embodiments, the decoupling capacitor 163 may be connected between a second end of an 8-stage pumping stage of the second pumping area PA2' and the ground GND (not shown). According to some example embodiments, the decoupling capacitor 163 may transfer an output of the first pumping area PA1' and an output of the second pumping area PA2' to a memory cell array region through the THV 140.

According to some example embodiments, the decoupling capacitor 163 may be disposed between the first pumping area PA1' and the second pumping area PA2'. The first pumping area PA1' and the second pumping area PA2' may be configured to be symmetrical with each other around the decoupling capacitor 163. The first pumping area PA1' and the second pumping area PA2' may each include a plurality of pumping stages.

According to some example embodiments, the pumping stage included in the first pumping area PA1' and the second pumping area PA2' may be arranged, such that pumping stages closer to the decoupling capacitor 163 have a greater number of stages. According to some example embodiments, pumping of the first pumping area PA1' may proceed toward the decoupling capacitor 163, and pumping of the second pumping area PA2' may also proceed toward the decoupling capacitor 163.

According to some example embodiments, outputs of the first pumping area PA1' and the second pumping area PA2' may be collected through the decoupling capacitor 163 disposed at the center and may be connected to the THV 140. In this regard, the peak current may be adjusted by separating stages of a pump and collecting outputs thereof to the center, thereby improving the performance. According to some example embodiments, MIM capacitors may be arranged in regions without the decoupling capacitor 163 and the signal controller 162.

Figure 13:
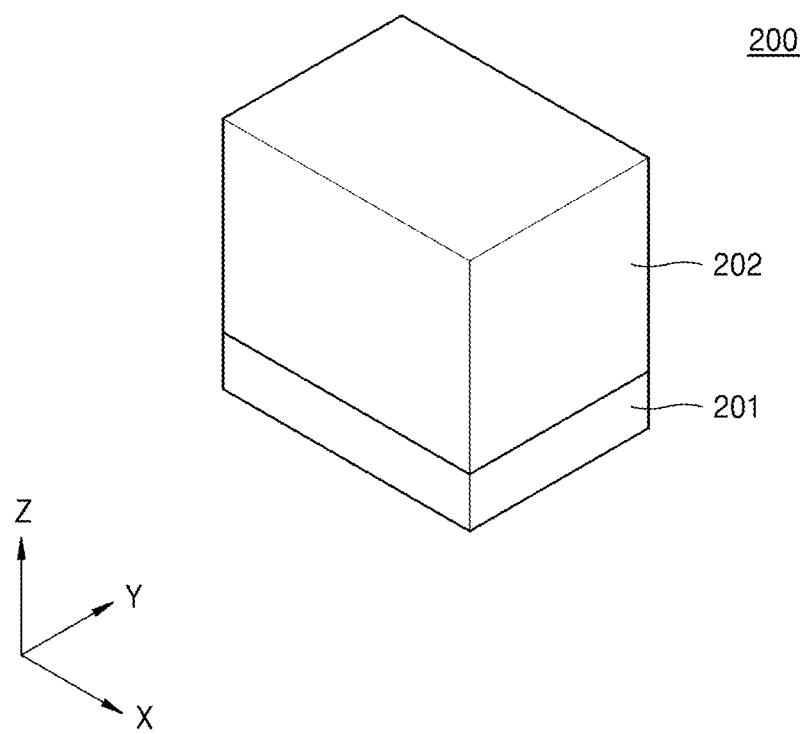
FIG. 13 is a schematic perspective view of a memory device according to some example embodiments.

FIG. 13 is a schematic perspective view of a memory device according to some example embodiments.

Referring to FIG. 13, a memory device 200 may include a first semiconductor layer 201 and a second semiconductor layer 202. The second semiconductor layer 202 may be stacked on the first semiconductor layer 201 in the Z-axis direction. According to some example embodiments, the memory cell array region 110 of FIG. 1 may be formed in the second semiconductor layer 202, and the peripheral circuit region 170 may be formed in the first semiconductor layer 201. In other words, the first semiconductor layer 201 may include a lower substrate, and, by forming semiconductor devices like transistors and patterns for wiring the semiconductor devices on the lower substrate, circuits, e.g., circuits corresponding to the control logic 150, the row decoder 120, the voltage generator 160, and the page buffer 130 may be formed in the first semiconductor layer 201.

After circuits are formed in the first semiconductor layer 201, the second semiconductor layer 202 including the memory cell array region 110 may be formed. In other words, the second semiconductor layer 202 may include an upper substrate, and the memory cell array region 110 may be formed on the upper substrate by being supported by the upper substrate.

Also, in the second semiconductor layer 202, patterns for electrically connecting the memory cell array region 110 (i.e., the word lines WL and the bit lines BL) and the circuits formed in the first semiconductor layer 201 (i.e., the peripheral circuit region 170) may be formed. As described above, memory cells included in the memory cell array region 110 may be accessed by the word lines WL and the bit lines BL, and the word lines WL and the bit lines BL may be electrically connected to the peripheral circuit region 170 formed in the first semiconductor layer 201.

Therefore, the memory device 200 may have a structure in which a memory cell array region 210 and a peripheral circuit 270 are arranged in a stacking direction (i.e., the Z-axis direction), that is, a cell-on-peri or cell-over-peri (COP) structure. By arranging circuits except for the memory cell array region 210 under the memory cell array region 210, the COP structure may effectively reduce an area occupied thereby in a plane perpendicular to the stacking direction, and thus the number of memory cells integrated in the memory device 200 may be increased.

A plurality of pads may be further arranged for electrical connection to the outside of the memory device 200. For example, a plurality of pads for a command CMD, an address ADDR, and a control signal CTRL received from a device outside the memory device 200 may be arranged, and a plurality of pads for inputting/outputting data DATA may be arranged. The pads may be arranged to be adjacent to the peripheral circuit 270, which processes signals received from the outside of the memory device 200 or signals to be transmitted to the outside of the memory device 200, in a vertical direction (a second direction) or a horizontal direction (a first direction or a third direction).

FIG. 14 is a perspective view of a memory device according to some example embodiments.

According to some example embodiments, FIG. 14 is a diagram for describing that the arrangement structure of a charge pump of a voltage generator is applied to the memory device of FIG. 13.

As described above, the first semiconductor layer 201 may include a peripheral circuit region (not shown). The peripheral circuit region may include a voltage generator 260. According to some example embodiments, the voltage generator 260 may include a clock driver 2621, a CTS 2622, a HV TR 2623, a gate pumping capacitor 2612, and a pumping capacitor 2611.

According to some example embodiments, the voltage generator 260 may receive a clock signal and power to the clock driver 2621 through a THV 240. According to some example embodiments, the THV 240 may be connected to an electrode pad 280 inside the first semiconductor layer 201. Alternatively, according to some example embodiments, the THV 240 may be connected to an external voltage contact (EVC). According to some example embodiments, the THV 240 may extend in the Z-axis direction to be electrically connected to the second semiconductor layer 202. According to some example embodiments, the THV 240 may be connected to the memory cell array of the second semiconductor layer 202 through a row decoder (not shown).

According to some example embodiments, power may be applied to the clock driver 2621 in a charge pump through electrode pads 280 inside and outside connected to THVs 240 or an EVC. According to some example embodiments, by disposing the clock driver 1621 to which power is first applied to be closest to the THV 240, the internal resistance of a charge pump may be reduced.

Figure 15:
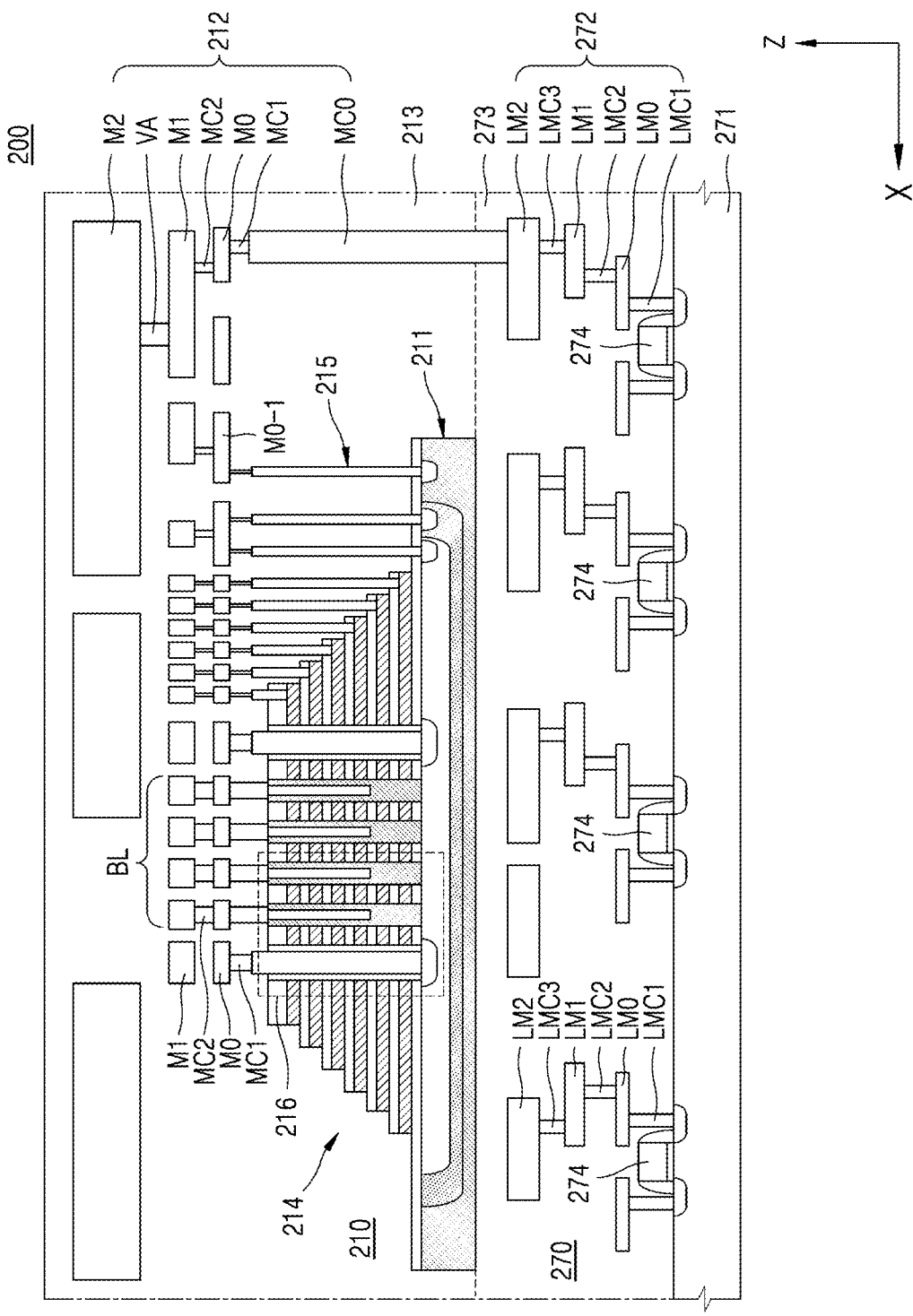
FIG. 15 is a cross-sectional view of an example of a memory device according to some example embodiments.

FIG. 15 is a cross-sectional view of an example of a memory device according to some example embodiments.

FIG. 15 is a cross-sectional view of a non-volatile memory device having a COP structure according to some example embodiments. Referring to FIG. 15, the non-volatile memory device 200 may have a COP structure in which a cell region 210 is stacked on the peripheral circuit region 270. At least a portion of the peripheral circuit region 270 and at least a portion of the cell region 210 may vertically overlap. For convenience, an example in which the cell region 210 and the peripheral circuit region 270 entirely overlap each other in the vertical direction is described herein, but the inventive concepts are not limited thereto.

The peripheral circuit region 270 may include one or more peripheral transistors 274 arranged on a lower substrate 271, peripheral circuit wires 272 electrically connected to the peripheral transistors 274, and a lower insulation layer 273 covering the peripheral circuit wires 272 and the peripheral transistors 274. According to some example embodiments, the peripheral transistors 274 of the peripheral circuit region 270 may be transistors included in the voltage generator 260. According to some example embodiments, the peripheral transistors 274 of the peripheral circuit region 270 may be transistors applied to another circuit included in the peripheral circuit region 270.

The cell region 210 may include an upper substrate 211, a cell array 214 disposed on the upper substrate 211, and an upper insulation layer 213 covering the cell array 214. The cell region 210 may further include connection circuit wires 212 for electrically connecting the cell array 214 and the peripheral circuit wires 272. The cell array 214 may include metal contacts 215 for electrically connecting the cell array 214 to the connection circuit wires 212.

In the peripheral circuit region 270, the lower substrate 271 may include a semiconductor substrate like a silicon wafer. According to some example embodiments, the peripheral circuit wires 272 may include lower metal lines LM0, intermediate metal lines LM1, and upper metal lines LM2 sequentially stacked on the lower substrate 271. The peripheral circuit wires 272 may further include lower metal contacts LMC1 electrically connecting the peripheral transistors 274 to the lower metal wires LM0, intermediate metal contacts LMC2 electrically connecting the lower metal wires LM0 to the intermediate metal wires LM1, and upper metal contacts LMC3 electrically connecting the intermediate metal wires LM1 to the upper metal wires LM2. According to some example embodiments, any one of such metal wires may be THVs.

In the cell region 210, the cell array 214 may have a 3-dimensional structure in which a plurality of cells are vertically stacked on the upper substrate 211 having a well structure. The metal contacts 215 may electrically connect a plurality of cells of the cell array 214 and the upper substrate 211 to the connection circuit wires 212.

The connection circuit wires 212 may be electrically connected to the peripheral circuit wires 272. The connection circuit wires 212 may include lower metal wires M0, intermediate metal wires M1, and upper metal wires M2 sequentially stacked on the cell array 214. The connection circuit wires 212 may further include connection metal contacts MC0 electrically connecting the peripheral circuit wires 272 to the connection circuit wires 212, lower metal contacts MC1 electrically connecting the connection metal contacts MC0 to the lower metal wires M0, intermediate metal contacts MC2 electrically connecting the lower metal wires M0 to the intermediate metal wires M1, and vias VA as upper metal contacts electrically connecting the intermediate metal wires M1 to the upper metal wires M2. The lower metal contacts MC1 may connect the cell array 214 to the intermediate metal wires M1. The intermediate metal wires M1 may include bit lines BL electrically connected to a vertical channel of the cell array 214.

The memory device 200 may be a non-volatile memory device. According to some example embodiments, the non-volatile memory device 200 may include a NAND flash memory, a vertical NAND flash (VNAND) memory, a NOR flash memory, and a resistive random access memory (RAM) (RRAM), a phase-change RAM (PRAM), a magnetoresistive RAM (MRAM), a ferroelectric RAM (FRAM), a spin transfer torque RAM (STT-RAM), etc. Also, the non-volatile memory device 200 may be implemented to have a 3-dimensional array structure. The inventive concepts may be applied not only to a flash memory device in which a charge storage layer includes a conductive floating gate, but also to a charge trap flash (CTF) in which a charge storage layer includes an insulation layer. The memory device 200 according to the inventive concepts may be a volatile memory device.

A memory device according to some example embodiments may be mounted by using various types of packages. According to some example embodiments, a memory device according to some example embodiments may be mounted by using packages like package-on-package (PoP), ball grid arrays (BGAs), chip scale packages (CSPs), a plastic leaded chip carrier (PLCC), a plastic dual in-line package (PDIP), a die in waffle pack, a die in wafer form, a chip-on-board (COB), a ceramic dual in-line package (CERDIP), a plastic metric quad flat pack (MQFP), a thin quad flat pack (TQFP), a small outline (SOIC), a shrink small outline package (SSOP), a thin small outline (TSOP), a system in package (SIP), a multi chip package (MCP), a wafer-level fabricated package (WFP), a wafer-level processed stack package (WSP), etc.

By changing the arrangement structure of a charge pump included in the voltage generator 260, the pumping efficiency and an output current of the voltage generator 260 embedded in a COP structure may be improved. In the case of a memory device having a COP structure, it may be difficult to apply a conventional charge pump structure due to a reduction in the area of a peripheral circuit region. However, by changing the structure of a charge pump having the same components, the performance of the charge pump may be improved.

Although the arrangement structure of a charge pump included in a voltage generator in the COP structure has been disclosed, the arrangement structure of the charge pump included in the voltage generator according to the inventive concepts is not limited to the COP structure. According to some example embodiments, the arrangement structure of a charge pump included in a voltage generator may also be applied to a memory device having a non-COP structure. According to some example embodiments, in a memory device having a non-COP structure, a voltage source to which a power line is connected may be applied as a region like a THV in a memory device having a COP structure. According to some example embodiments, in the case of a memory device having the COP structure, the arrangement of components in a voltage generator may be determined based on THVs. According to some example embodiments, in the case of a memory device having a non-COP structure, the arrangement of components in a voltage generator may be determined based on a voltage source to which a power line is connected. According to some example embodiments, the same arrangement conditions of components in a voltage generator may be applied to a COP structure and a non-COP structure.

While the inventive concepts have been particularly shown and described with reference to some example embodiments thereof, it will be understood that various changes in form and details may be made therein without departing from the spirit and scope of the following claims.

What is claimed is:
1. A memory device comprising:
   a memory cell array region electrically connected to a plurality of word lines and a plurality of bit lines and the memory cell array region comprising a plurality of memory cells stacked vertically on a substrate; and
   a peripheral circuit region under the memory cell array region, wherein
      the memory cell array region and the peripheral circuit region are electrically connected to each other by through vias extending in a first direction,
      the peripheral circuit region comprises a voltage generator configured to generate an operating voltage to apply to the word lines to operate the memory cells,
      the voltage generator comprises
         a pumping capacitor unit including one or more pumping capacitors configured to perform charge pumping to charge and pump a voltage based on a clock signal, and
         a signal controller configured to control the clock signal and a current flowing through the pumping capacitor unit, the signal controller being adjacent to the through vias, the signal controller comprising
            a clock driver configured to apply a clock signal to the pumping capacitor unit, and a high-voltage transistor configured to pre-charge the pumping capacitor unit to a first voltage, and a first distance between the through vias and the signal controller in a second direction is smaller than a second distance between the through vias and the one or more pumping capacitors in the second direction, and the second direction is perpendicular to the first direction.

2. The memory device of claim 1, wherein
the signal controller further comprises a plurality of charge transfer switches configured to control the current flowing through the pumping capacitor unit.

3. The memory device of claim 2, wherein
the clock driver receives power through the through vias to generate a clock signal, and
a third distance between the through vias and the clock driver in the second direction is smaller than a fourth distance between the through vias and the plurality of charge transfer switches in the second direction.

4. The memory device of claim 2, wherein
the plurality of charge transfer switches comprise an NMOS transistor and a PMOS transistor, and
a third distance between the one or more pumping capacitors and the NMOS transistor in the second direction is greater than a fourth distance between the one or more pumping capacitors and the PMOS transistor in the second direction.

5. The memory device of claim 1, wherein
the signal controller comprises
a plurality of charge transfer switches configured to control a second current applied to the pumping capacitor unit, and
the pumping capacitor unit comprises
a plurality of pumping capacitors configured to perform charge pumping in response to a plurality of clock signals, and
a gate pumping capacitor connected to a gate of one of the plurality of charge transfer switches.

6. The memory device of claim 5, wherein
the clock driver is configured to receive power through the through vias to generate a clock signal, and
a third distance between the through vias and the clock driver in the second direction is smaller than a fourth distance between the through vias and the plurality of charge transfer switches in the second direction.

7. The memory device of claim 5, wherein
the clock driver is configured to receive power through the through vias to generate a clock signal, and
a third distance between the through vias and the clock driver in the second direction is smaller than a fourth distance between the through vias and the high-voltage transistor in the second direction.

8. The memory device of claim 5, wherein
the pumping capacitor unit comprises a high-voltage device, and
a third distance between the high-voltage transistor and the pumping capacitor unit in the second direction is smaller than a fourth distance between the charge transfer switches and the pumping capacitor unit in the second direction.

9. The memory device of claim 5, wherein
a third distance between the high-voltage transistor and the pumping capacitor unit in the second direction is greater than a fourth distance between the charge transfer switches and the pumping capacitor unit in the second direction, and a first body voltage of the pumping capacitor unit and a second body voltage of the high-voltage transistor are not shared.

10. The memory device of claim 5, wherein the plurality of charge transfer switches and the clock driver are arranged adjacent to each other in the first direction in the signal controller.

11. The memory device of claim 1, wherein the pumping capacitor is a metal-insulator-metal (MIM) capacitor.

12. A voltage generator comprising:
first to n-th pumping stages, wherein
n is a natural number equal to or greater than 2,
the first pumping stage comprises a first pumping capacitor unit and a first signal controller,
the n-th pumping stage comprises an n-th pumping capacitor unit and an n-th signal controller,
the first to n-th pumping stages are arranged side-by-side in a first direction,
the first pumping capacitor unit and the first signal controller are arranged side-by-side in a second direction perpendicular to the first direction in the first pumping stage,
the n-th pumping capacitor unit and the n-th signal controller are arranged side-by-side in a second direction perpendicular to the first direction in the n-th pumping stage,
the first signal controller comprises a plurality of first charge transfer switches and a first clock driver configured to apply a clock signal to the first pumping capacitor unit,
the n-th signal controller comprises a plurality of n-th charge transfer switches and an n-th clock driver configured to apply a clock signal to the n-th pumping capacitor unit,
the plurality of first charge transfer switches are arranged between the first clock driver and the first pumping capacitor unit,
the plurality of n-th charge transfer switches are arranged between the n-th clock driver and the n-th pumping capacitor unit,
the first to n-th clock drives are configured to receive power from through vias,
a first distance between the through vias and a first clock driver in the second direction is same as a second distance between the through vias and a second clock driver in the second direction,
the first signal controller comprises a first high-voltage transistor, and
the n-th signal controller comprises an n-th high-voltage transistor.

13. The voltage generator of claim 12, wherein
the first clock driver, a first charge transfer switch, and a first high-voltage transistor are sequentially arranged in the second direction in the first signal controller, and
the n-th clock driver, an n-th charge transfer switch, and an n-th high-voltage transistor are sequentially arranged in the second direction in the n-th signal controller.

14. The voltage generator of claim 13, wherein
the first charge transfer switch comprises a first NMOS transistor and a first PMOS transistor,
the n-th charge transfer switch comprises an n-th NMOS transistor and an n-th PMOS transistor,
in the first signal controller, the first clock driver, the first NMOS transistor, the first PMOS transistor, and the first high-voltage transistor are sequentially arranged in the second direction, and the n-th signal controller, the n-th clock driver, the n-th NMOS transistor, the n-th PMOS transistor, and the n-th high-voltage transistor are sequentially arranged in the second direction.

15. The voltage generator of claim 12, wherein
an m-th pumping stage is included in the first to n-th pumping stages, the m-th pumping stage comprises an m_L-th pumping stage and an m_R-th pumping stage,
an output phase of a clock driver included in the m_L-th pumping stage is opposite to an output phase of a clock driver included in the m_R-th pumping stage,
the output phase of the clock driver included in the m_L-th pumping stage is same as an output phase of a clock driver included in a pumping stage adjacent to the m_L-th pumping stage,
the output phase of the clock driver included in the m_R-th pumping stage is same as an output phase of a clock driver included in a pumping stage adjacent to the m_R-th pumping stage, and
m is equal to or greater than 1 and less than or equal to n.

16. A voltage generator comprising
a plurality of pumping stages,
a first pumping area on a first side with respect to a central portion of the voltage generator;
a second pumping area on a second side with respect to the central portion of the voltage generator; and,
a decoupling capacitor disposed between the first pumping area and the second pumping area,
wherein the first pumping area and the second pumping area are symmetrical to each other around the central portion.

17. The voltage generator of claim 16, wherein a first number of pumping stages included in the first pumping area is same as a second number of pumping stages included in the second pumping area.

18. The voltage generator of claim 16, wherein
each of the plurality of pumping stages included in the first pumping area comprises a first clock driver,
each of the plurality of pumping stages included in the second pumping area comprises a second clock driver, and
the first clock driver and the second clock driver are configured to receive power from through vias, and a first distance between the through vias and the first clock driver is the same as a second distance between the through vias and the second clock driver.

* * * * *